(12) United States Patent
Kobayashi

(10) Patent No.: US 10,847,558 B2
(45) Date of Patent: Nov. 24, 2020

(54) SOLID-STATE IMAGING APPARATUS AND METHOD FOR MANUFACTURING THE SOLID-STATE IMAGING APPARATUS HAVING SEALING PORTION DISPOSED IN BONDED MEMBERS

(71) Applicant: CANON KABUSHIKI KAISHA, Tokyo (JP)

(72) Inventor: Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 407 days.

(21) Appl. No.: 15/956,504

(22) Filed: Apr. 18, 2018

(65) Prior Publication Data

US 2018/0233523 A1    Aug. 16, 2018

Related U.S. Application Data

(63) Continuation of application No. 14/619,515, filed on Feb. 11, 2015, now Pat. No. 9,972,650, which is a
(Continued)

(30) Foreign Application Priority Data

Jun. 30, 2010 (JP) ................................. 2010-149488
Jun. 22, 2011 (JP) ................................. 2011-138657

(51) Int. Cl.
*H01L 27/146* (2006.01)

(52) U.S. Cl.
CPC .... *H01L 27/14618* (2013.01); *H01L 27/1464* (2013.01); *H01L 27/1469* (2013.01);
(Continued)

(58) Field of Classification Search
CPC . H01L 27/1214; H01L 27/124; H01L 27/127; H01L 27/14634; H01L 27/14636; H01L 27/1464; H01L 27/1469
(Continued)

(56) References Cited

U.S. PATENT DOCUMENTS 5,943,574 A * 8/1999 Tehrani ............. H01L 21/76838
257/E21.412
2009/0146148 A1    6/2009 Pyo
(Continued)

FOREIGN PATENT DOCUMENTS

EP         2230691 A2    9/2010
JP      2000299379 A   10/2000
(Continued)

*Primary Examiner* — Que Tan Le
(74) *Attorney, Agent, or Firm* — Canon U.S.A., Inc. IP Division

(57) ABSTRACT

A solid-state imaging apparatus includes a first substrate that includes a plurality of photoelectric conversion units, a second substrate that includes at least a part of a readout circuit configured to read signals based on electric charges of the plurality of photoelectric conversion units and a peripheral circuit including a control circuit, and a wiring structure that is disposed between the first substrate and the second substrate and includes a pad portion electrically connected to the peripheral circuit via a draw-out wiring and an insulating layer. The wiring structure has, at least at a part thereof, a seal ring disposed in such a way as to surround the photoelectric conversion units and the peripheral circuit.

24 Claims, 13 Drawing Sheets

Related U.S. Application Data continuation of application No. 13/807,057, filed as application No. PCT/JP2011/003635 on Jun. 24, 2011, now Pat. No. 8,987,648.

(52) U.S. Cl.
CPC .. *H01L 27/14634* (2013.01); *H01L 27/14636* (2013.01); *H01L 2224/80895* (2013.01); *H01L 2224/80896* (2013.01); *H01L 2924/0002* (2013.01)

(58) Field of Classification Search
USPC .......................................... 250/214 R, 208.1
See application file for complete search history.

(56) References Cited

U.S. PATENT DOCUMENTS

| | | |
|---|---|---|
| 2010/0045837 A1 | 2/2010 | Yamashita |
| 2011/0127631 A1 | 6/2011 | Kawashima |
| 2011/0186917 A1 | 8/2011 | Akiyama |

FOREIGN PATENT DOCUMENTS

| | | |
|---|---|---|
| JP | 2002026123 A | 1/2002 |
| JP | 2004146816 A | 5/2004 |
| JP | 2004-297022 A | 10/2004 |
| JP | 2005235977 A | 9/2005 |
| JP | 2006156960 A | 6/2006 |
| JP | 2006-191081 A | 7/2006 |
| JP | 2006190839 A | 7/2006 |
| JP | 2007-067216 A | 3/2007 |
| JP | 2007059676 A | 3/2007 |
| JP | 2008-028243 A | 2/2008 |
| JP | 2008060606 A | 3/2008 |
| JP | 2009076518 A | 4/2009 |
| JP | 2009-170448 A | 7/2009 |
| JP | 2009170448 A | 7/2009 |
| JP | 2010506404 A | 2/2010 |
| JP | 2010-109137 A | 5/2010 |
| JP | 2011-054637 A | 3/2011 |
| JP | 2011-114261 A | 6/2011 |
| JP | 2011-159706 A | 8/2011 |
| JP | 6342033 B2 | 6/2018 |
| WO | 2007/148891 A1 | 12/2007 |
| WO | 2010/006916 A1 | 1/2010 |

\* cited by examiner

SOLID-STATE IMAGING APPARATUS AND METHOD FOR MANUFACTURING THE SOLID-STATE IMAGING APPARATUS HAVING SEALING PORTION DISPOSED IN BONDED MEMBERS

CROSS-REFERENCE TO RELATED APPLICATION

This application is a Continuation of co-pending U.S. patent application Ser. No. 14/619,515, filed Feb. 11, 2015; which is Continuation of U.S. patent application Ser. No. 13/807,057, filed Dec. 27, 2012, which now becomes U.S. Pat. No. 8,987,648, issued Mar. 24, 2015; which is a National Phase application of International Application PCT/JP2011/003635, filed Jun. 24, 2011; which claims the benefit of Japanese Patent Application No. 2010-149488 filed Jun. 30, 2010, and No. 2011-138657 filed Jun. 22, 2011, which are hereby incorporated by reference herein in their entirety.

TECHNICAL FIELD

The present invention relates to a solid-state imaging apparatus which is formed by laminating a plurality of members.

BACKGROUND ART

As a representative configuration of a solid-state imaging apparatus, it is conventionally known to form photoelectric conversion units on one substrate and form peripheral circuit portions on another substrate, and then electrically connect these members with micro bumps.

A backside illumination type solid-state imaging apparatus discussed in Japanese Patent Application Laid-Open No. 2009-170448 includes a first semiconductor substrate on which a photoelectric conversion unit and a readout circuit for reading a signal are provided to constitute each pixel, and a second semiconductor substrate on which a peripheral circuit that processes a signal read from the pixel is provided. The first semiconductor substrate and the second semiconductor substrate are laminated with each other.

CITATION LIST

Patent Literature

[PTL 1]
Japanese Patent Application Laid-Open No. 2009-170448

SUMMARY OF INVENTION

Technical Problem

A general semiconductor substrate, which includes various circuits, is required to have the capability of protecting internal elements against water and ions entering from an external environment surrounding the semiconductor substrate. Hence, in a solid-state imaging apparatus including the first semiconductor substrate and the second semiconductor substrate as discussed in Japanese Patent Application Laid-Open No. 2009-170448, it is necessary to protect the internal components from water and ions entering from the ambient environment.

The present invention relates to a solid-state imaging apparatus having improved moisture resistance.

Solution to Problem

According to an aspect of the present invention, a solid-state imaging apparatus includes a plurality of pixels each of which includes a photoelectric conversion unit and a readout circuit configured to process a signal generated by the photoelectric conversion unit or configured to read the signal, and a peripheral circuit configured to read signals from the plurality of pixels. The plurality of photoelectric conversion units is disposed in a first member, and at least a part of the readout circuit and the peripheral circuit are disposed in a second member. The first member and the second member are bonded in such a way that a signal from the photoelectric conversion unit can be received by the readout circuit disposed in the second member. The solid-state imaging apparatus includes a sealing portion configured to reduce water invasion from an outside region of the solid-state imaging apparatus into the plurality of pixels and the peripheral circuit, wherein the sealing portion includes a first sealing portion disposed in the first member and a second sealing portion disposed in the second member, and a part of the first sealing portion is in contact with a part of the second sealing portion.

Advantageous Effects of Invention

The present invention can provide a solid-state imaging apparatus capable of protecting internal elements, for example, from water that may enter from an external environment.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

The present invention is described below in detail with reference to attached drawings. In the following description of exemplary embodiments, one principal plane of a first substrate and one principal plane of a second substrate are substrate surfaces on which photoelectric conversion units or transistors are disposed. An opposite side of the principal plane is referred to as a backside of the first substrate and the second substrate respectively. Further, in the following description, a direction from the backside of each substrate to the principal plane thereof is referred to as an upward direction. A direction from the principal plane of the substrate to the backside thereof is referred to as a downward direction or a depth direction.

In the present invention, a seal ring is described as an example of a sealing portion provided to reduce water invasion from the outside. However, the shape of the sealing portion is not limited to the ring shape. Any other sealing members having appropriate moisture resistant property can be used.

Example 1

Figure 8A:
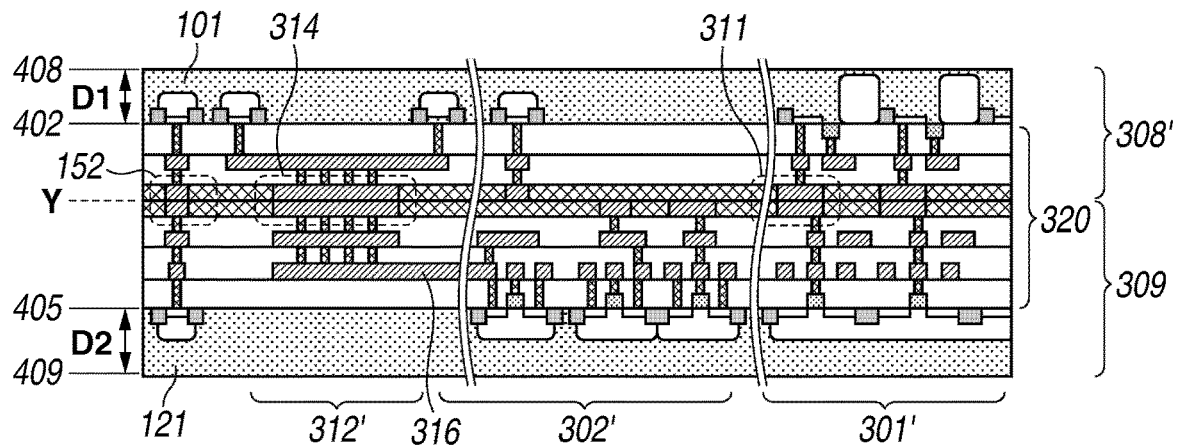
FIG. 8A is a cross-sectional view schematically illustrating a manufacturing method of the solid-state imaging apparatus according to the first exemplary embodiment.
Figure 8B:
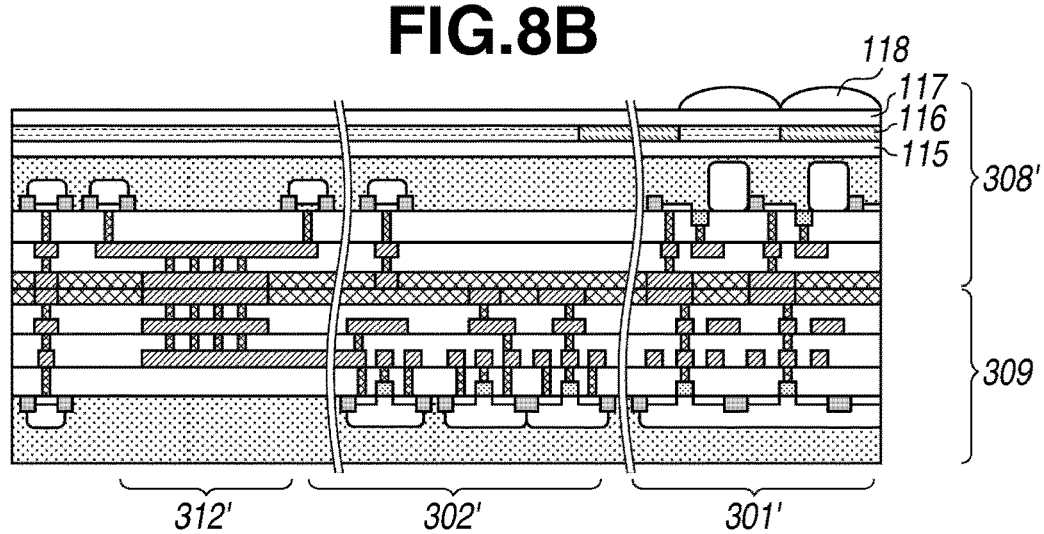
FIG. 8B is a cross-sectional view schematically illustrating a manufacturing method of the solid-state imaging apparatus according to the first exemplary embodiment.
Figure 8C:
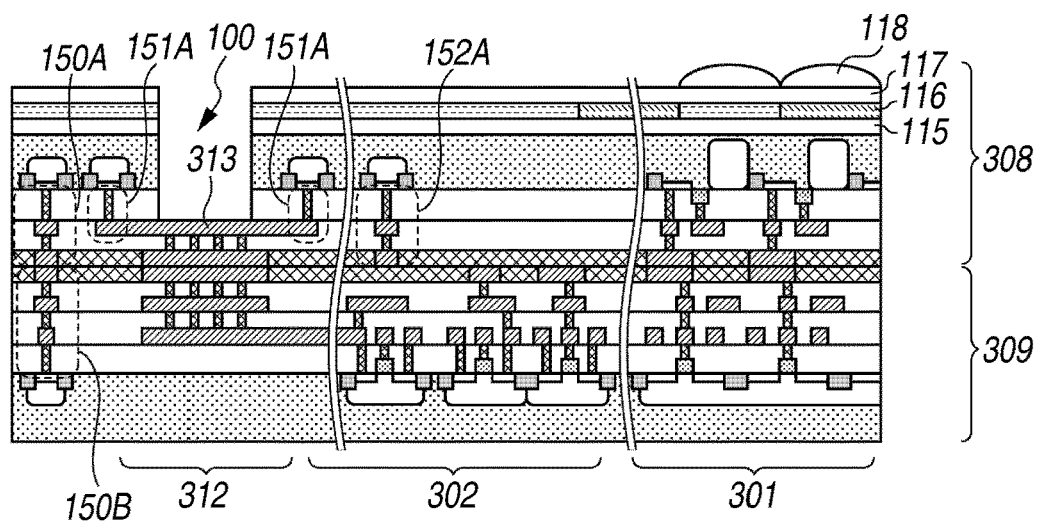
FIG. 8C is a cross-sectional view schematically illustrating a manufacturing method of the solid-state imaging apparatus according to the first exemplary embodiment.

A first exemplary embodiment of the present invention is described below with reference to FIGS. 1A and 1B though FIGS. 8A to 8C.

Figure 1A:
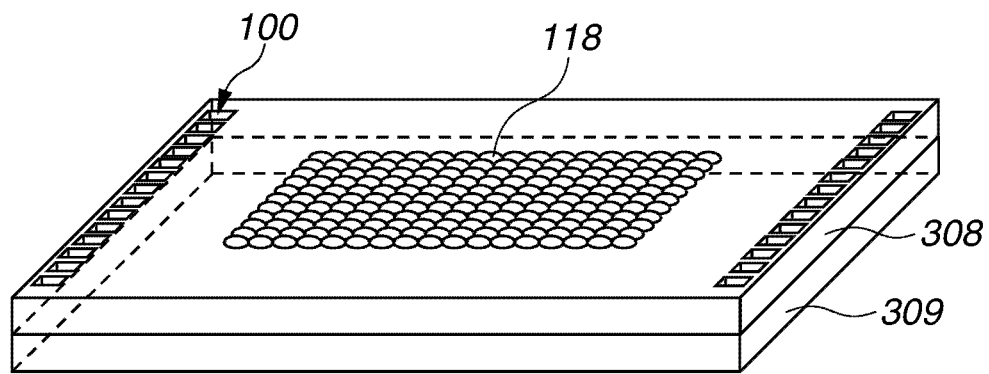
FIG. 1A is a perspective view illustrating a solid-state imaging apparatus according to a first exemplary embodiment.
Figure 1B:
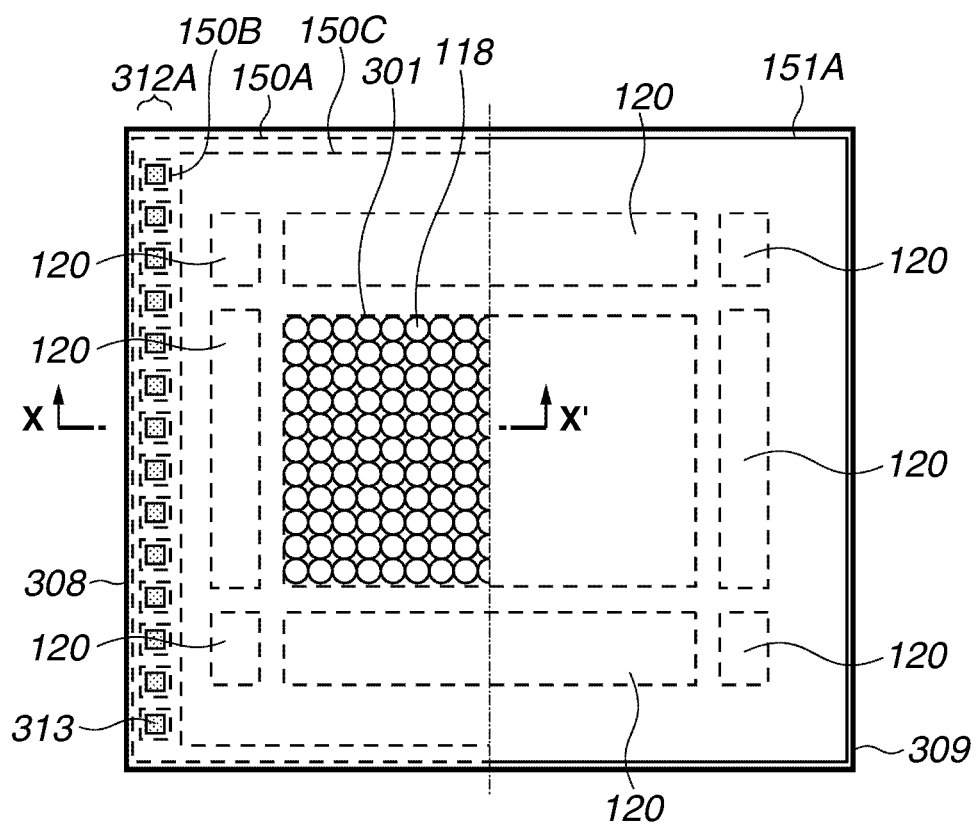
FIG. 1B is a plan view illustrating the solid-state imaging apparatus according to the first exemplary embodiment.

FIGS. 1A and 1B illustrate a solid-state imaging apparatus according to the first exemplary embodiment. FIG. 1A is a perspective view illustrating the solid-state imaging apparatus. FIG. 1B is a plan view illustrating the solid-state imaging apparatus illustrated in FIG. 1A, which is seen from a light incidence side thereof. As illustrated in FIG. 1A, the solid-state imaging apparatus according to the present exemplary embodiment includes a first member 308 and a second member 309 that cooperatively form a laminated structure. The first member 308 includes a first substrate. The second member 309 includes a second substrate. A wiring structure is disposed between the first substrate and the second substrate. It is desired that the wiring structure is constituted by a plurality of wiring layers. In the following description, each constituent component located on the first member 308 is suffixed with "A", and each constituent component located on the second member 309 is suffixed with "B."

The first member 308 and the second member 309 are sequentially positioned from the light incidence side of the solid-state imaging apparatus. FIG. 1B illustrates the first member 308 at the left half thereof and illustrates the second member 309 (i.e., a state where the first member 308 is omitted) at the right half thereof. The right half, where the first member 308 is not illustrated, can be arranged in the same manner as the left half.

The solid-state imaging apparatus illustrated in FIGS. 1A and 1B includes pixel portions 301A and 301B. A plurality of photoelectric conversion units, each corresponding to a pixel, is disposed on the pixel portion 301A. A microlens 118 can condense incidence light to each photoelectric conversion unit. Each peripheral circuit 120 includes various circuits configured to read signals from the pixel portion 301. A main part of the peripheral circuit 120 is located on the second member 309. A part of the peripheral circuit 120 can be located on the first member 308.

A plurality of pads 313 is disposed on a pad portion 312A. The plurality of pads 313 can include input pads and output pads (hereinafter, simply referred to as "pads") to input and output signals from and to external circuits. Each pad 313 can be constituted, for example, by a conductive pattern that forms a part of the wiring structure. In general, the conductive pattern that forms the wiring is surrounded by an insulating member. To provide electrical connection between the pads and the external circuits, openings 100 are formed on the insulating member on the pads.

A plurality of seal rings 150A, 151A, 152A, and 150B is provided to reduce water from entering inside the device. The seal ring 150A is disposed along the outermost periphery of the first member 308. The seal ring 152A is positioned inside the seal ring 150A and is disposed between the pad portion 312A and the pixel portion 301A. The seal ring 151A is disposed in such a way as to surround each pad 313 disposed on the pad portion 312A. The seal ring 150B is disposed along the outermost periphery of the second member 309.

More specifically, the first member 308 has a first sealing portion that includes the seal rings 150A to 152A. The second member has a second sealing portion that includes the seal ring 150B. Each seal ring can protect the corresponding member from water invasion entering from the outside. As described below, a part of the first sealing portion is in contact with a part of the second sealing portion. More specifically, a surface of the first sealing portion that faces the second member 309 is in contact with a surface of the second sealing portion that faces the first member 308.

The seal rings are described below in more detail. Each seal ring according to the present invention can be classified into one of the following four types depending on its arrangement. In the following exemplary embodiments, sealing portions are an appropriate combination of the following four types of seal rings.

First, the seal rings that belong to a first classification includes a seal ring disposed along the outermost periphery of each member, such as the seal rings 150A and 150B described in the following exemplary embodiments. The seal rings 150A and 150B are positioned outside the pixel portion, the peripheral circuit portion, and the pad portion in each member.

The seal rings that belong to a second classification include a seal ring disposed along the periphery of each pad disposed on the pad portion in such a way as to surround the pad, such as the seal rings 151A and 151B described in the following exemplary embodiments.

The seal rings that belong to a third classification include a seal ring disposed between the pad portion and the pixel portion or between the pad portion and the peripheral circuit portion, such as the seal rings 152A and 152B described in the following exemplary embodiments.

The seal rings that belong to a fourth classification include a sealing portion constituted by an insulating member disposed on a contact surface where two members are laminated and bonded. A passivation layer is functionally operable as a sealing portion belonging to the fourth classification. More specifically, the passivation layer can be made of a material containing SiN or SiON, each of which has high moisture-absorption characteristics compared to a material containing $SiO_2$ and thus shows excellent sealing property.

In the present invention, the seal rings belonging to the above-described four classifications can be appropriately combined to form sealing portions. More specifically, the first sealing portion disposed in the first member is brought into contact with the second sealing portion disposed in the second member to constitute a sealing portion. To enhance the sealing properties, among the sealing portions disposed on respective members, it is desired to bring seal rings that belong to the same classification into contact with each other.

Figure 2:
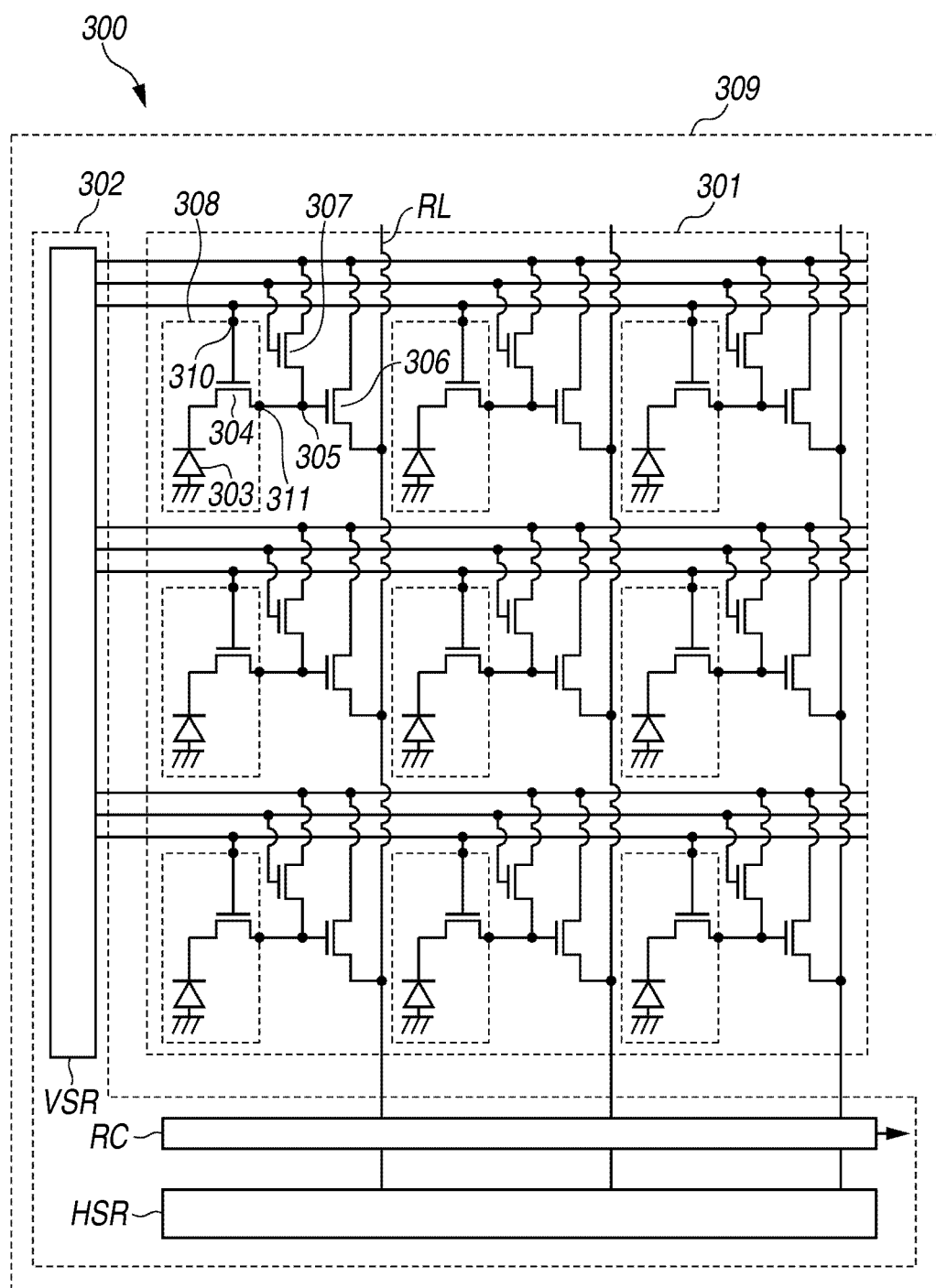
FIG. 2 illustrates a circuit diagram of the solid-state imaging apparatus according to the first exemplary embodiment.

Next, an equivalent circuit diagram of the solid-state imaging apparatus according to the first exemplary embodiment is described below with reference to FIG. 2. In the present exemplary embodiment, signal charges are electrons. A solid-state imaging apparatus 300 illustrated in FIG. 2 includes a pixel portion 301 on which a plurality of pixels is arranged. Each pixel includes a photoelectric conversion unit and a readout circuit for processing or reading a signal generated from the photoelectric conversion unit. Further, the solid-state imaging apparatus 300 includes a peripheral circuit portion 302 provided to read signals from the plurality of pixels. A plurality of peripheral circuits 120 (see FIG. 1B) is disposed on the peripheral circuit portion 302.

The pixel portion 301 is constituted by a plurality of portions, each including a photoelectric conversion unit 303, a transfer transistor 304, an amplifying transistor 306, and a reset transistor 307. A structure including one photoelectric conversion unit 303 is referred to as a pixel. One pixel according to the present exemplary embodiment includes the photoelectric conversion unit 303, the transfer transistor 304, the amplifying transistor 306, and the reset transistor 307. A source of the transfer transistor 304 is connected to the photoelectric conversion unit 303. A drain of the transfer transistor 304 is connected to a gate of the amplifying transistor 306. A node 305 represents the gate of the amplifying transistor 306.

A source of the reset transistor 307 is connected to the node 305 to set an electric potential of the node 305 to an arbitrary value (e.g., a reset potential). It is configured that a reset voltage can be applied to a drain of the reset transistor 307. In the present exemplary embodiment, the amplifying transistor 306 is a part of a source follower circuit and is configured to output a signal representing the electric potential of the node 305 to a signal line RL. The node 305 can be configured to include a floating diffusion.

A plurality of peripheral circuits is disposed on the peripheral circuit portion 302. For example, the peripheral circuit portion 302 includes a vertical scanning circuit VSR that can supply a control signal to a gate of a transistor provided on the pixel portion 301 and a readout circuit RC that can perform signal processing, such as amplification, addition, or analog-to-digital (AD) conversion, on a signal output from the pixel portion 301. Further, the peripheral circuit portion 302 includes a horizontal scanning circuit HSR that can supply pulses to the readout circuit RC to output signals successively from the readout circuit RC.

In the solid-state imaging apparatus according to the first exemplary embodiment, the plurality of photoelectric conversion units 303 is disposed on the first member 308. At least a part of the readout circuit of the pixel and the peripheral circuit are disposed on the second member 309. More specifically, the photoelectric conversion unit 303 and the transfer transistor 304 constitute the pixel portion 301A disposed on the first member 308. The remaining constituent elements of the pixel constitute the pixel portion disposed on the second member 309. The arrangement of the transistors that constitute each pixel portion of the first substrate and the second substrate is not limited to the above-described configuration and can be appropriately modified considering situations.

A connecting portion 310 is a node for electrically connecting a gate of the transfer transistor 304 located on the first substrate to the peripheral circuit 120 disposed on the second member. A practical configuration of the connecting portion 310 is described below.

The electric charge generated by the photoelectric conversion unit 303 can be read at the drain of the transfer transistor 304, i.e., the node 305. The node 305 can include the configuration provided on the first member 308 and the configuration provided on the second member 309. More specifically, the configuration included in the first member 308 is a floating diffusion and a part of a first wiring structure electrically connected to the floating diffusion. The configuration included in the second member 309 is the source of the reset transistor 307, the gate of the amplifying transistor 306, and a part of the second wiring structure that electrically connects these terminals to a part of the first wiring structure.

When the above-described configuration is employed, the area of each photoelectric conversion unit 303 can be increased and the sensitivity can be improved, compared to a conventional circuit arrangement in which the pixel portion and the peripheral circuit portion are entirely arranged on one member (i.e., one substrate). Further, compared to the conventional configuration, if the area of the photoelectric conversion unit remains the same, a greater number of photoelectric conversion units 303 can be provided and it is useful to realize a multiple pixel arrangement. Further, a part of the first wiring structure of the first member 308 and a part of the second wiring structure of the second member 309 can cooperatively constitute a sealing portion that can reduce water invasion from the outside of the solid-state imaging apparatus.

Figure 3A:
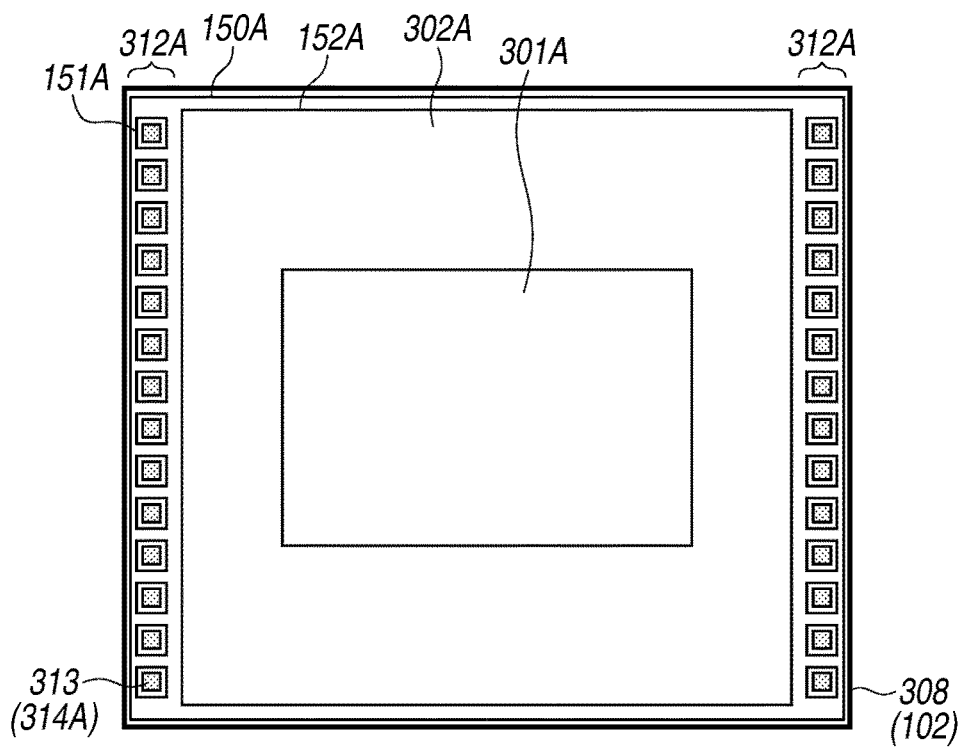
FIG. 3A is a plan view schematically illustrating a plan view layout of the solid-state imaging apparatus according to the first exemplary embodiment.
Figure 3B:
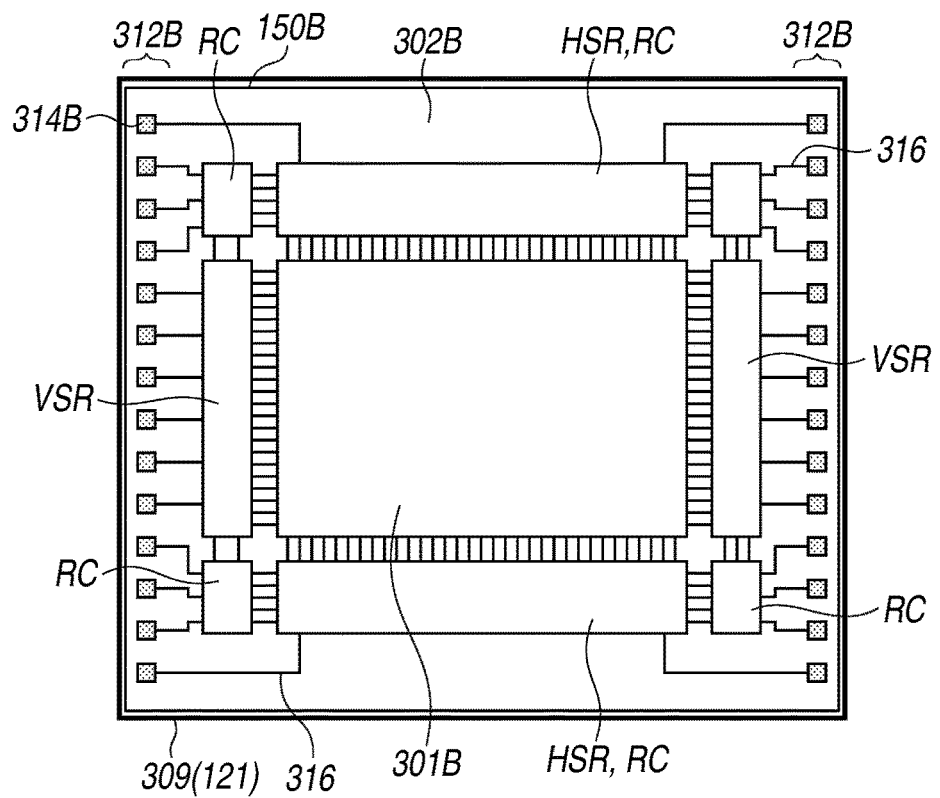
FIG. 3B is a plan view schematically illustrating a plan view layout of the solid-state imaging apparatus according to the first exemplary embodiment.

A practical plan view layout of the solid-state imaging apparatus is described below with reference to schematic plan views of the solid-state imaging apparatus illustrated in FIGS. 3A and 3B. FIG. 3A is a top view illustrating a plan view layout of the first member 308. FIG. 3B is a top view illustrating a plan view layout of the second member 309. Portions whose functions are similar to those illustrated in FIGS. 1A, 1B and 2 are denoted by the same reference numerals and their descriptions are not repeated.

In FIG. 3A, the first member 308 includes the pixel portion 301A on which a plurality of photoelectric conversion units 303 is disposed and the pad portion 312A on which a plurality of pads 313 is disposed. More specifically, a plurality of photoelectric conversion units 303 and a plurality of transfer transistors 304 are disposed on the pixel portion 301A. Further, a plurality of connecting portions 314A for being electrically connected to the second member 309 and the corresponding pads 313 are disposed at the same positions when seen from the top. The connecting portion can be constituted by a conductive pattern that is formed in the same layer as a wiring layer included in the wiring structure.

If the pad 313 is used as an input pad, a signal or a power source voltage input via the pad 313 is supplied to a circuit of the second member 309 via the corresponding connecting portion 314A. If the pad 313 is used as an output pad, a signal from the second member 309 is transmitted to the pad 313 via the corresponding connecting portion 314A. The pads include electrode pads which are electrically connected to external circuits and disposed on the wiring layer, and electrode pads which are connected to through electrodes that extend from one surface of a semiconductor substrate to the other surface thereof.

Next, as illustrated in FIG. 3B, the pixel portion 301B, a peripheral circuit portion 302B, and a pad portion 312B are provided on the second member 309. The pad portion 312B is an area in which pads themselves are not disposed but a conductive pattern to be electrically connected to the pads 313 on the second member 309 is disposed. Transistors that constitute the readout circuits of the pixel are disposed on the pixel portion 301B. For example, a plurality of amplifying transistors 306 and a plurality of reset transistors 307 illustrated in FIG. 2 are disposed on the pixel portion 301B.

The horizontal scanning circuits HSR, the vertical scanning circuits VSR, and the readout circuits RC are disposed on the peripheral circuit portion 302. Connecting portions 314B are disposed on the pad portion 312B so that the connecting portions 314B can be connected to the corresponding connecting portions 314A disposed on the first member 308. The horizontal scanning circuits HSR, the vertical scanning circuits VSR, and the readout circuits RC are electrically connected to corresponding connecting portions 314B via draw-out wirings 316.

The first member 308 and the second member 309, whose plan view layouts are illustrated in FIG. 3A and FIG. 3B, are separate examples of the two laminated members that constitute the solid-state imaging apparatus according to the present exemplary embodiment illustrated in FIGS. 1A and 1B. More specifically, the pixel portion 301A and the pixel portion 301B are disposed so as to overlap with each other. Further, the connecting portions 314A are electrically connected to the connecting portions 314B.

The peripheral circuit portion 302A illustrated in FIG. 3A is an area of the first member 308 that corresponds to the peripheral circuit portion 302B of the second member 309B illustrated in FIG. 3B. A part of the scanning circuit can be disposed on the peripheral circuit portion 302A. Alternatively, no circuit element can be disposed on the peripheral circuit portion 302A. As roles allocated to the first member 308 and the second member 309, the first member 308 includes at least the photoelectric conversion units, and the second member 309 includes at least a part of the pixel readout circuits or the peripheral circuits.

Next, sealing portions of the first member 308 are described below. The following description is based on an arrangement of the sealing portions vertically projected on a first substrate 101 from the second member 309 side. The seal ring 150A is disposed along the outermost periphery of the first member 308. In the present exemplary embodiment, the outermost periphery is, for example, a boundary indicating an external area where no circuit element is disposed or no conductive pattern is disposed. Further, the seal ring 151A is disposed so as to surround each of the plurality of pads 313, which are provided around the pixel portion 301.

The seal ring 151A can be electrically connected to the pad 313 and to a semiconductor area disposed on the first substrate 101. An electrostatic destruction protection circuit can be formed to include the semiconductor area to which the seal ring 151A is connected. A protection diode can be used as an example element for the electrostatic destruction protection circuit. The seal ring 151A can reduce water invasion through each pad opening 100. Further, the seal ring 151A can eliminate the influence of external noises.

The seal ring 152A is disposed between the pad portion 312A and the pixel portion 301. When the seal ring 151A is employed, it is desired that the seal ring 152A is disposed between an edge portion of the seal ring 151A positioned on the pixel portion side and the pixel portion 301. It is desired that the seal ring 152A can surround the pixel portion 301.

Next, sealing portions of the second member 309 are described below. The following description is based on an arrangement of the sealing portions vertically projected on a second substrate 121 from the first member 308.

The seal ring 150B of the second member 309 is disposed along the outermost periphery of the second member 309. If a plurality of draw-out wirings 316 is provided for electrical connection between each peripheral circuit 120 and a corresponding connecting portion 314B, it is desired that the seal ring 150B is located outside the plurality of draw-out wirings 316. As illustrated, it is desired that the seal ring 150B is disposed to surround the plurality of draw-out wirings 316. In a case where the pads 313 are disposed on the pad portions 312B of the second member 309, a seal ring 151B (not illustrated) that is disposed in the same manner as the seal ring 151A of the first member 308 can be provided.

The positional relationship between the seal rings on the first member 308 and the second member 309, in a state where the first member 308 and the second member 309 are laminated, can be in an overlapped relationship or in a non-overlapped relationship. In particular, if a passivation layer is provided on the surface side of the wiring structure, it is unnecessary to dispose the seal rings of the first and second members in an overlapped fashion because the passivation layer constitutes a part of the sealing portion. In this case, it is desired that the passivation layer is constituted by a material having excellent moisture-absorption characteristics compared to other insulating film that constitutes the wiring structure. A practical material for the passivation layer is a material containing nitrogen, such as SiN or SiON, components.

Further, if the seal rings, which are constituted by electric conductors, of the first member 308 and the second member 309 are arranged to come into contact with each other, moisture resistance can be improved and reliability can be improved. Further, in a case where the seal rings (electric conductors) of the first and second members are brought into contact with each other and continuously integrated as a sealing portion, the seal rings can suppress a chipping range from increasing when a wafer of the first member 308 and a wafer of the second member 309 are bonded together and then subjected to dicing. Further, the yield rate and the reliability can be improved.

Figure 4:
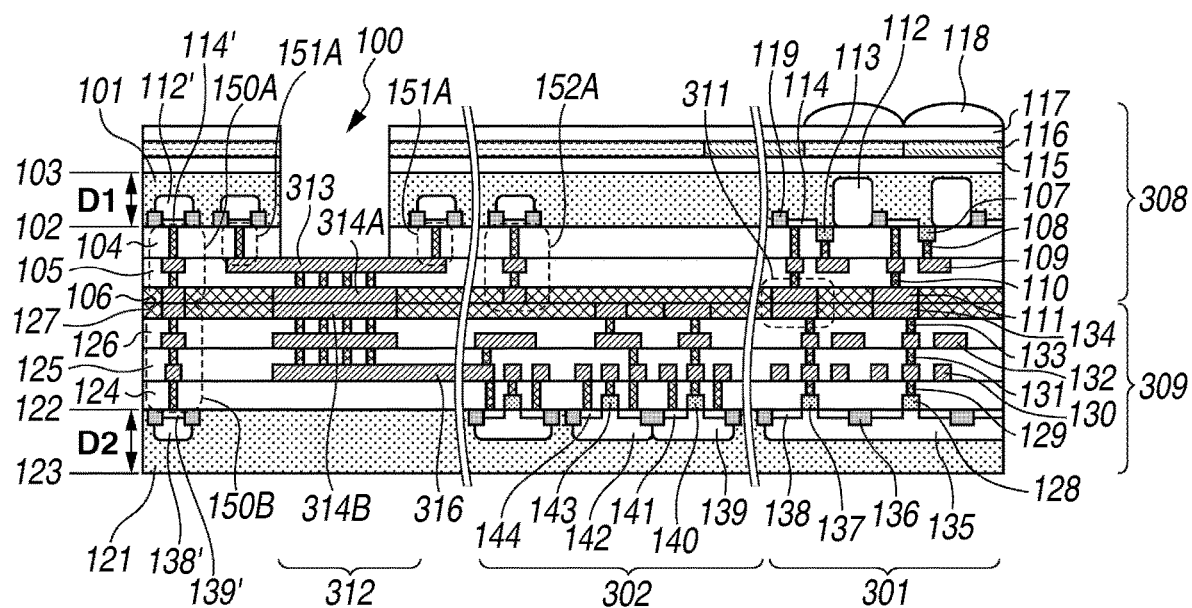
FIG. 4 is a cross-sectional view schematically illustrating the solid-state imaging apparatus according to the first exemplary embodiment.

FIG. 4 is a schematic cross-sectional view taken along a line X-X' illustrated in FIG. 1B. The solid-state imaging apparatus, which has the circuit illustrated in FIG. 2 and the plan view layouts illustrated in FIGS. 3A and 3B, is described below with reference to FIG. 4. In FIG. 4, constituent components similar to those illustrated in FIG. 1A to FIG. 3B are denoted by the same reference numerals and their descriptions are not repeated.

The solid-state imaging apparatus according to the present exemplary embodiment includes the first substrate, the second substrate, and the wiring structure disposed between the first substrate and the second substrate. It is desired that the first substrate is a semiconductor substrate that is included in the first member 308. It is desired that the second substrate is a semiconductor substrate that is included in the second member 309.

It is desired that the wiring structure is a multi-layered structure constituted by a plurality of wiring layers with each intervening insulating layer. Further, as an example configuration of the wiring structure, the first member 308 can include the first wiring structure and the second member 309 can include the second wiring structure. In this case, each of the first wiring structure and the second wiring structure can be configured to have a multilayered structure constituted by a plurality of wiring layers with each intervening insulating layer. As another example configuration of the wiring structure, only one of the first member and the second member can be configured to have a wiring structure.

The first member 308 includes the first wiring structure, which includes at least the insulating layer and the wiring layer, and the first substrate 101. The first substrate 101 is, for example, a semiconductor substrate that includes a principal plane 102 and a backside 103. The first substrate 101 according to the present exemplary embodiment is an n-type silicon semiconductor substrate. The photoelectric conversion unit 303 is disposed on the principal plane 102 of the first substrate.

The first wiring structure includes interlayer insulating films 104 to 106 and a gate electrode layer 107 including a gate electrode and a gate wiring. Further, the first wiring structure includes wiring layers 109 and 111 including a plurality of wirings and plug layers 108 and 110 including a plurality of contact plugs or via plugs. The interlayer insulating film 106 is a passivation layer that is disposed on the topmost surface of the first wiring structure. In the present exemplary embodiment, the passivation layer (i.e., the interlayer insulating film 106) is an insulating film containing SiN components.

An n-type semiconductor area 112, which constitutes the photoelectric conversion unit 303, and an n-type semiconductor area 114, which is a drain of a transfer transistor, in other words, a floating diffusion, are disposed on the first substrate 101. Further, an element isolation structure 119 is disposed on the first substrate 101. The element isolation structure 119 can be constituted by an insulating member. Alternatively, a PN junction isolation structure can be employed instead of the insulating member. Further, it is feasible to employ both the insulating member and the PN junction isolation structure.

The transfer transistor 304 can be constituted by the n-type semiconductor area 112, the n-type semiconductor area 114, and a gate electrode 113 included in the gate electrode layer 107. In response to a driving pulse supplied to the gate electrode 113, electric charge of the n-type semiconductor area 112 can be transferred to the n-type semiconductor area 114. The electric potential based on the electric charge having been transferred to the n-type semiconductor area 114 can be transmitted to the second member 309 via the plug layer 108, the wiring layer 109, the plug layer 110, and the wiring layer 111.

A part of the conductive pattern included in the wiring layer 111 constitutes a connecting portion 311A. The photoelectric conversion unit 303 is appropriately changeable. For example, the photoelectric conversion unit 303 can be constituted by an embedded photodiode that includes a p-type semiconductor area provided on the light-receiving surface side, or can be constituted by a photogate.

A planarization layer 115, a color filter layer 116 including a plurality of color filters, a planarization layer 117, and a microlens layer 118 including a plurality of microlenses are disposed in this order on the backside 103 of the first substrate 101, at a portion corresponding to the pixel portion 301A. Each of the plurality of color filters and each of the plurality of microlenses illustrated in FIG. 4 are disposed to correspond to one photoelectric conversion unit, i.e., disposed for each pixel. However, each of the color filters and each of the microlenses can be provided commonly for a plurality of pixels. The solid-state imaging apparatus according to the present exemplary embodiment can be referred to as a backside illumination type solid-state imaging apparatus which is configured to receive incoming light via the microlens layer 118 by the photoelectric conversion unit.

The pads 313 and the openings 100, via which the pads 313 are exposed, are disposed on the pad portion 312A of the first member 308. Further, the connecting portions 314A electrically connected to the pads 313 are disposed on the pad portion 312A. The connecting portions 314A can be constituted by the conductive pattern included in the wiring layer 111.

A part of the first wiring structure of the first member 308 constitutes seal rings. The seal rings 150A, 151A, and 152A can be formed by a conductive pattern that is manufactured in the same process as that of the wiring layers and plug layers.

An area of the first substrate 101 where the seal ring 150A is vertically projected from the second member 309 is disposed along the outermost periphery of the first member. Accordingly, an area of the first substrate where the plurality of photoelectric conversion units is disposed, i.e., the pixel portion 301A, is positioned inside the area where the seal ring 150A is projected. The seal ring 150A is positioned outside the pixel portion 301A and the pad portion 312A and entirely surrounds them.

An area of the first substrate 101 where the seal ring 152A is vertically projected from the second member 309 is positioned between the pixel portion 302 and the pad portion 312A. Further, it is desired that the seal ring 152A can surround the pixel portion 301A.

It will be easier to understand the above-described arrangements and positional relationships with reference to FIG. 4 and FIG. 3A. The seal rings 150A and 152A are disposed in such a way as to extend from the principal plane 102 of the first substrate 101 to an opposite surface of the interlayer insulating film 106 that does not face the first substrate 101. In other words, the seal rings 150A and 152A have a structure including an electric conductor continuously extending from the semiconductor substrate to a surface of the interlayer insulating film 106 that is functionally operable as a passivation film and contacts the second member 309.

In the present exemplary embodiment, the seal ring 151A is disposed so as to surround each pad 313 disposed on the pad portion 312A.

Providing at least one of the seal rings 150A and 152A is effective to secure appropriate moisture resistance because a water invasion path extending from an edge portion of the solid-state imaging apparatus or a pad opening to an internal element of the solid-state imaging apparatus becomes narrower.

Further, the electric potential of the substrate can be supplied to each seal ring via, for example, semiconductor areas 114' and 112', which are disposed on the first substrate 101 and are similar to the first substrate 101 in conduction type. When the above-described configuration is employed, adverse influences of exogenous noises can be suppressed.

The second member 309 includes the second wiring structure and the second substrate 121. The second substrate 121 is, for example, a semiconductor substrate that includes a principal plane 122 and a backside 123. Transistors are disposed on the principal plane 122 of the second substrate. The second wiring structure includes interlayer insulating films 124 to 127, a gate electrode layer 128 including a gate electrode and a wiring, wiring layers 130, 132, and 134 including a plurality of wirings, and plug layers 129, 131, and 133 including a plurality of contacts or via plugs.

A conductive pattern included in the wiring layer 134, which is an uppermost wiring layer, includes a portion electrically connected to the first member 308. The interlayer insulating film 127 is a passivation layer that is disposed on the topmost surface of the second wiring structure. In the present exemplary embodiment, the passivation layer can be formed by a material containing nitrogen, such as SiN or SiON, components.

Disposed on the pixel portion 301B of the second substrate 121 are a p-type semiconductor area 135 that provides a channel of the amplifying transistor 306, an n-type source area of the amplifying transistor 306, a drain area 138, and an element isolation structure 136. The amplifying transistor 306 is constituted by a gate electrode 137 included in the gate electrode layer 128, a source area, and the drain area 138.

In the present exemplary embodiment, the connecting portion 311A of the first member 308 is electrically connected to the gate electrode 137 of the amplifying transistor via the wiring layer 134, the plug layer 133, the wiring layer 132, the plug layer 131, the wiring layer 130, and the plug layer 129. In the present exemplary embodiment, the node 305 illustrated in FIG. 2 is configured to include the n-type semiconductor area 114, the wirings of the wiring layers 109, 111, 134, 132, and 130, the contact plugs or via plugs of the plug layers 108, 110, 133, 131, and 129, and the gate electrode 137 illustrated in FIG. 4. The remaining circuit (e.g., reset transistors) of the pixel portion 301B is not illustrated.

The horizontal scanning circuit HSR and the vertical scanning circuit VSR are disposed on the peripheral circuit portion 302 of the second member 309. FIG. 4 illustrates an n-type transistor and a p-type transistor, which constitute an arbitrary circuit included in the peripheral circuit portion 302. The n-type transistor is configured to include a gate electrode 140 included in the gate electrode layer 128, an n-type source area disposed in a P-type semiconductor area 139, and a drain area 141. The p-type transistor is configured to include a gate electrode 143 included in the gate electrode layer 128, a p-type source area disposed in an n-type semiconductor area 142, and a drain area 144.

The seal ring 150B can be constituted by a part of the wiring layers and the plug layers that constitute the second wiring structure. An area of the second substrate 121 where the seal ring 150B is vertically projected from the first member 308 is positioned along the outermost periphery of the second member 309. Alternatively, the above-described area can be positioned outside the peripheral circuit portion 302 that includes various peripheral circuits. It will be easier to understand the above-described arrangements and positional relationships with reference to FIG. 4 and FIG. 3B.

The seal ring 150B is disposed in such a way as to extend from the principal plane 122 of the second substrate 121 to an opposite surface of the interlayer insulating film 127 that does not face the second substrate 121. The interlayer insulating film 127 functions as a passivation film. In other words, the seal ring 150B has a structure including an electric conductor continuously extending from the semiconductor substrate to a surface of the interlayer insulating film 106 that contacts the first member 308. The interlayer insulating film 106 functions as a passivation film.

As illustrated in FIG. 4, the seal ring 150A is in contact with the seal ring 150B. More specifically, a conductive pattern of the wiring layer 111 that constitutes the topmost surface of the seal ring 150A, which is positioned on the second member 309 side, is in contact with a conductive pattern of the wiring layer 134 that constitutes the topmost surface of the seal ring 150B, which is positioned on the first member 308 side.

The electric potential of the substrate can be supplied to the seal ring 150B via semiconductor areas 138' and 139' which are disposed on the second substrate 121 and are similar to the second substrate 121 in conduction type. Thus, when the seal ring 150B is employed, adverse influences of exogenous noises can be suppressed.

The first member 308 and the second member 309 are assembled in such a manner that the principal plane 102 of the first substrate 101 faces to the principal plane 122 of the second substrate 121 (face-to-face arrangement), and constitute the solid-state imaging apparatus.

Thus, the above-described configuration can reduce water from invading into the element area including the pixel portion 301A of the first member 308, and the pixel portion 301B and the peripheral circuit portion 302B of the second member 309.

Further, as exposure surfaces of respective pads 313 are disposed on the backside of the first member 308, it becomes easier to assure electrical connection between external circuits and the pads 313. Therefore, the above-described arrangement can reduce contact defectiveness.

Figure 5A:
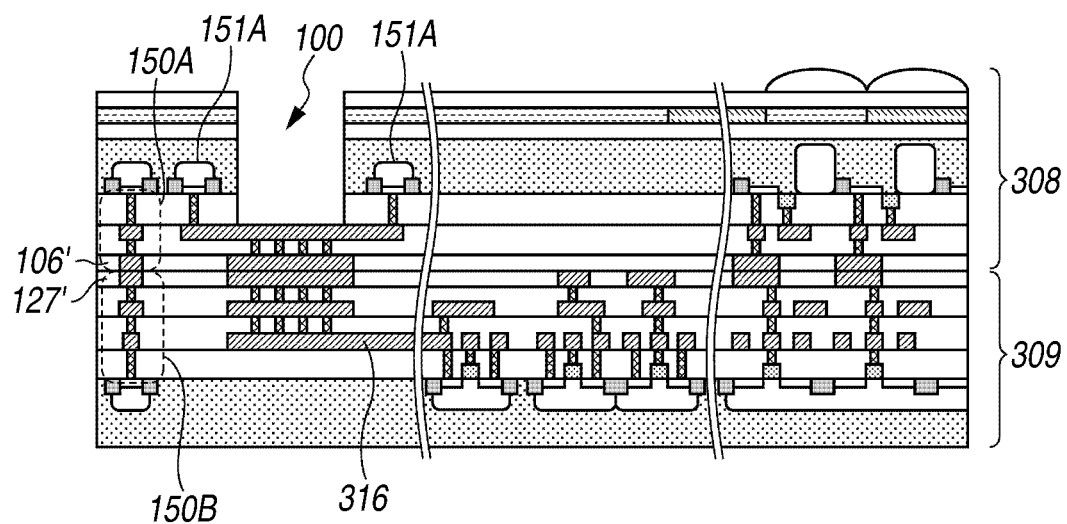
FIG. 5A is a cross-sectional view schematically illustrating a solid-state imaging apparatus according to the first exemplary embodiment.

Here, a modified example of the solid-state imaging apparatus illustrated in FIG. 4 is described below with reference to schematic cross-sectional views of FIG. 5A and FIG. 5B. A solid-state imaging apparatus illustrated in FIG. 5A is different from the solid-state imaging apparatus illustrated in FIG. 4 in that insulating layers 106' are disposed on the topmost surfaces of the first and second wiring structures. The function of the insulating layer 106' as a passivation layer is lower compared to that of a material containing SiN components. The remaining portions that are functionally similar to the constituent components illustrated in FIG. 4 are denoted by the same reference numerals and their descriptions are not repeated.

Further, the configuration illustrated in FIG. 5A does not include the seal ring 152A. Even in this case, the seal ring 151A can secure satisfactory moisture resistance. The solid-state imaging apparatus illustrated in FIG. 5A includes the seal rings 150A and 150B. Thus, the above-described configuration can reduce the possibility of water invasion from the topmost surfaces of the first and second members 308 and 309 that may occur in a case where no passivation layer is provided.

Figure 5B:
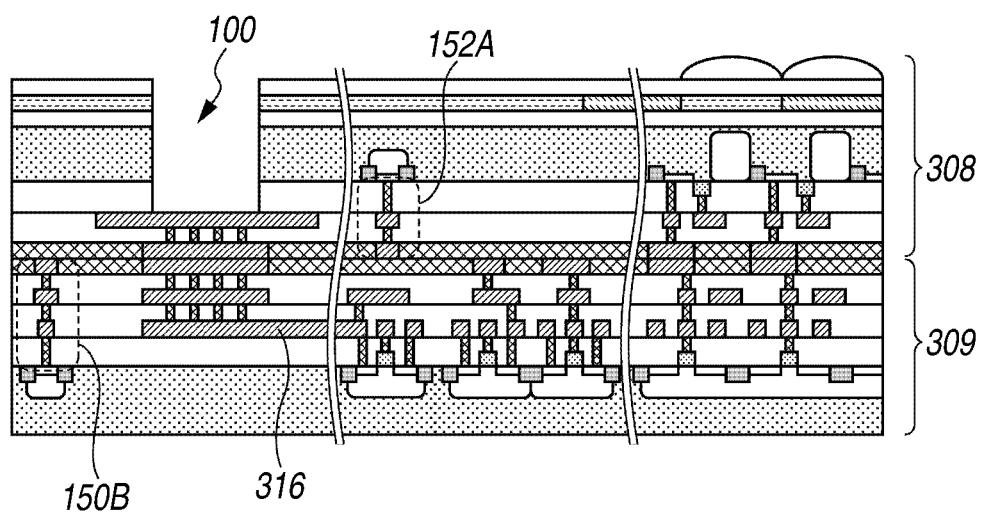
FIG. 5B is a cross-sectional view schematically illustrating a solid-state imaging apparatus according to the first exemplary embodiment.

Next, a solid-state imaging apparatus illustrated in FIG. 5B is described below. The solid-state imaging apparatus illustrated in FIG. 5B is different from the solid-state imaging apparatus illustrated in FIG. 4 in that both of the seal rings 150A and 151A are omitted. Further, interlayer insulating films 106' and 127' which function as passivation layers are disposed in such a way as to constitute the topmost surfaces of the first and second members 308 and 309 respectively. The solid-state imaging apparatus illustrated in FIG. 5B includes the seal rings 152A and 150B.

When the above-described structure is employed, the conductive pattern of the first member 308 and the conductive pattern of the second member 309 constitute a part of the sealing portion while the conductive patterns provide an electrical connection between the pads 313 and the second member 309. The above-described configuration can reduce water invasion via a cross-sectional area of the first wiring structure at each pad opening 100. Each seal ring has a multi-layered structure of conductive patterns which are formed by a material similar to the wiring layers and the plug layers included in the wiring structures.

Figure 6A:
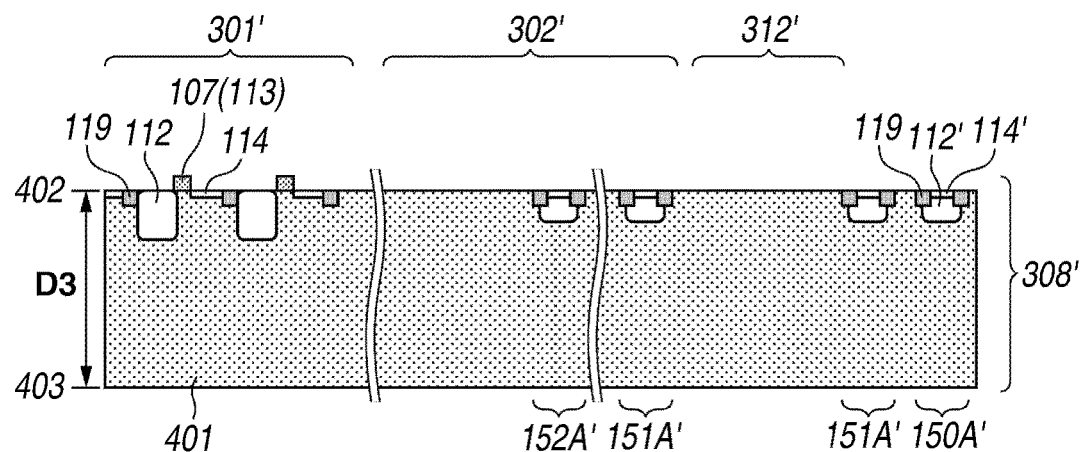
FIG. 6A is a cross-sectional view schematically illustrating a manufacturing method of the solid-state imaging apparatus according to the first exemplary embodiment.
Figure 6B:
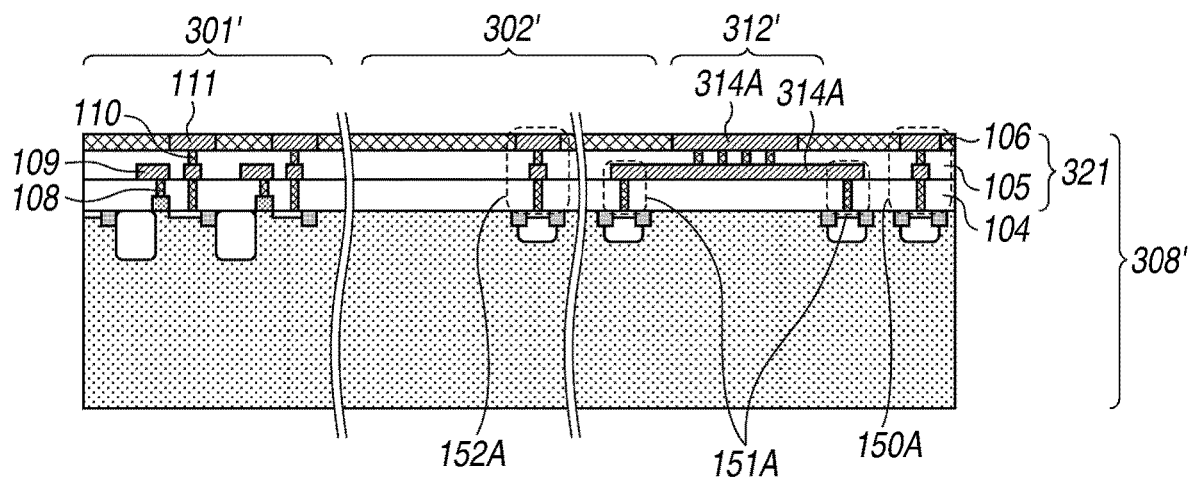
FIG. 6B is a cross-sectional view schematically illustrating a manufacturing method of the solid-state imaging apparatus according to the first exemplary embodiment.
Figure 7A:
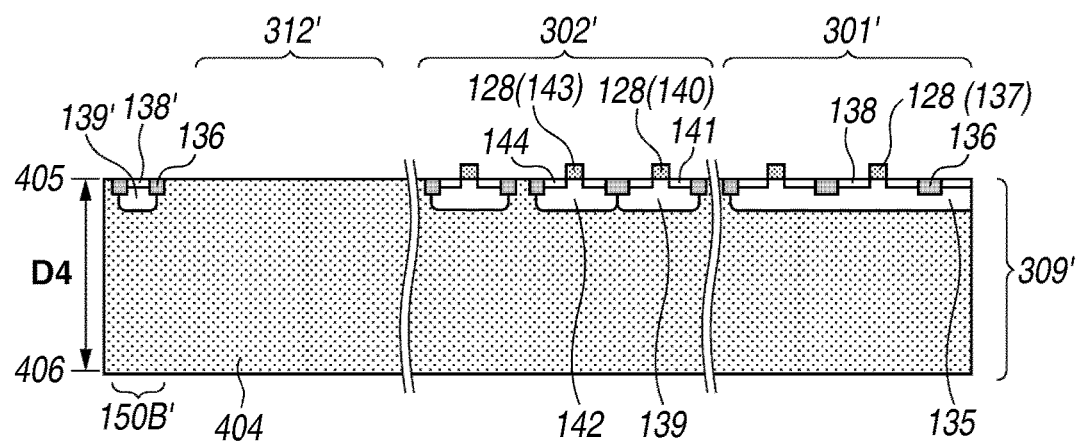
FIG. 7A is a cross-sectional view schematically illustrating a manufacturing method of the solid-state imaging apparatus according to the first exemplary embodiment.
Figure 7B:
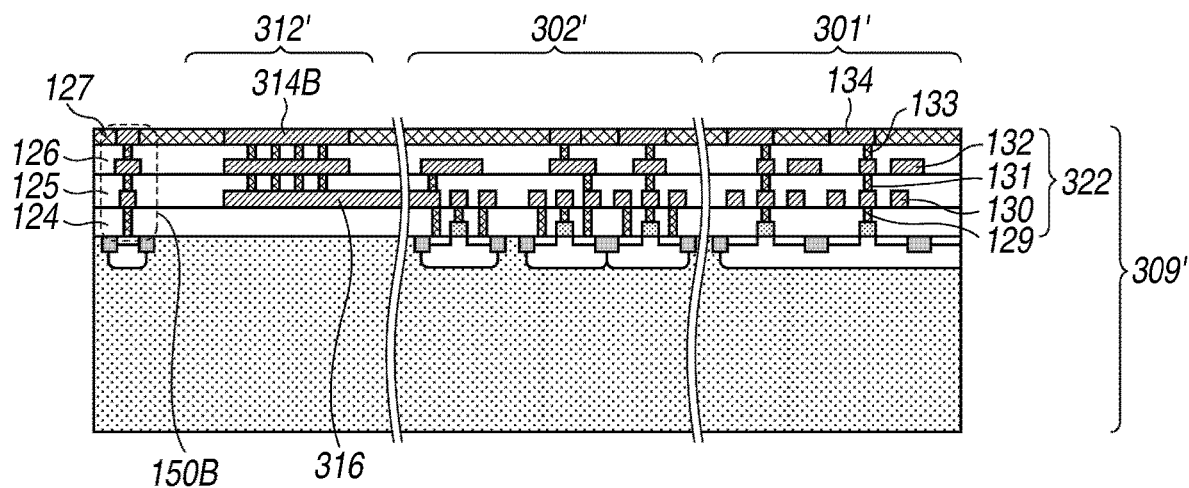
FIG. 7B is a cross-sectional view schematically illustrating a manufacturing method of the solid-state imaging apparatus according to the first exemplary embodiment.

Next, an example method for manufacturing the solid-state imaging apparatus illustrated in FIG. 4 according to the present exemplary embodiment is described below with reference to FIGS. 6A to 8C. FIGS. 6A and 6B are cross-sectional views schematically illustrating manufacturing processes of the first member 308. FIGS. 7A and 7B are cross-sectional views schematically illustrating manufacturing processes of the second member 309. FIGS. 8A to 8C are cross-sectional views schematically illustrating manufacturing processes after the first member 308 and the second member 309 are bonded.

The manufacturing processes of the first member 308 illustrated in FIG. 4 are described below with reference to FIGS. 6A and 6B. In FIGS. 6A and 6B, a configuration 308' is an unfinished portion to be later completed as the first member 308 illustrated in FIG. 4. Circuit element regions 301', 302', and 312' are unfinished portions to be later completed as the pixel portion 301, the peripheral circuit portion 302, and the pad portion 312, as illustrated in FIG. 4. Seal ring regions 150A', 151A', and 152A' are unfinished portions to be later completed as the seal rings 150A, 151A, and 152A.

In the manufacturing processes of the first member 308 according to the present exemplary embodiment, first a semiconductor substrate 401 is prepared and elements are formed on the semiconductor substrate 401. The semiconductor substrate 401 includes a principal plane 402 and a backside 403. The semiconductor substrate 401 has a thickness of D3. The material chiefly constituting the semiconductor substrate 401 is a silicon material.

The element isolation structure 119 is formed on the semiconductor substrate 401. The element isolation structure 119 is, for example, a local oxidation of silicon (LOCOS) or shallow trench isolation (STI) structure that includes an insulating member. Alternatively, the element isolation structure 119 can be a structure that includes a PN junction isolation structure or a combination of an insulating member and the PN junction isolation structure. A semiconductor area (not illustrated) that functions as P-type and N-type wells is formed on the semiconductor substrate 401. Then, the n-type semiconductor areas 112 and 114 that constitute a photoelectric conversion unit are formed. Further, n-type semiconductor areas 112' and 114' that are electrically connected to electric conductors constituting the seal rings are formed. The n-type semiconductor areas 112' and 114' can be configured to be similar to the substrate in conduction type.

Next, the gate electrode layer 107 is formed. The gate electrode layer 107 is, for example, a polysilicon-made member, and can include not only a gate electrode but also a wiring. In the present exemplary embodiment, general semiconductor processes are employable to form the gate electrode and the element isolation and semiconductor areas, although detailed description thereof is omitted. When the above-described manufacturing processes have been thoroughly finished, the configuration illustrated in FIG. 6A can be obtained.

The manufacturing processes further include forming a first wiring structure 321 on the principal plane of the semiconductor substrate 401. The first wiring structure 321 includes the interlayer insulating films 104, 105, and 106, the plug layers 108 and 110, and the wiring layers 109 and 111. In the present exemplary embodiment, the interlayer insulating films can be constituted by silicon dioxide films, silicon nitride films, or organic resin films. The wiring layers can be constituted by wirings chiefly containing aluminum components or electric conductors chiefly containing copper components.

The interlayer insulating film 106 which is the topmost interlayer insulating film functions as a passivation film and can be constituted by a silicon oxynitride film or a silicon nitride film. The contact plugs can be, for example, tungsten members. Further, via plugs can be also tungsten members. If a copper material is used to form the wiring, a material chiefly containing copper components can be selected to constitute via plugs as a so-called damascene structure.

In the present exemplary embodiment, the connecting portions 314A can be formed by the conductive pattern that constitutes the wiring layer 111. A material chiefly containing copper components can be used to form the conductive pattern. Further, the pads 313 can be constituted by the conductive pattern included in the wiring layer 109. A material chiefly containing aluminum components can be used to form the pads. Further, general semiconductor processes are employable to form the wiring layers, the plug layers, and the interlayer insulating film, although detailed description thereof is omitted. When the above-described manufacturing processes have been thoroughly finished, the configuration illustrated in FIG. 6B can be obtained.

Next, manufacturing processes of the second member 309 illustrated in FIG. 4 are described below with reference to FIGS. 7A and 7B. In FIGS. 7A and 7B, a configuration 309' is an unfinished portion to be later completed as the second member 309 illustrated in FIG. 4. Regions 301', 302', and 312' are unfinished portions to be later completed as the pixel portion 301B, the peripheral circuit portion 302B, and the pad portion 312B, as illustrated in FIG. 4. A region 150B' is an unfinished portion to be later completed as the seal ring 150B.

The manufacturing processes of the second member 309 according to the present exemplary embodiment include preparing a semiconductor substrate 404 and forming elements on the semiconductor substrate 404. The semiconductor substrate 404 includes a principal plane 405 and a backside 406. The semiconductor substrate 404 has a thickness of D4. Then, the element isolation structure 136 is formed on the semiconductor substrate 404. The element isolation structure 136 is, for example, the LOCOS or STI structure. Further, the P-type semiconductor areas 135 and 139 that function as p-type wells and the n-type semiconductor area 142 that functions as an n-type well are formed on the semiconductor substrate 404. Then, the n-type semiconductor areas 138 and 141 that form a source area and a drain area that constitutes a transistor, the p-type semiconductor area 144, and a semiconductor area that constitutes a protection diode are formed.

Further, the manufacturing processes include forming n-type semiconductor areas 138' and 139' that are electrically connected to electric conductors constituting the seal rings. The n-type semiconductor areas 138' and 139' can be configured to be similar to the substrate in conduction type. Then, the gate electrode layer 128, which includes the gate electrodes 137, 140, and 143 of transistors and wirings (i.e., resistors), is formed by deposition and patterning of a polysilicon layer. In the present exemplary embodiment, general semiconductor processes are employable to form the gate electrode and the element isolation and semiconductor areas, although detailed description thereof is omitted. When the above-described manufacturing processes have been thoroughly finished, the configuration illustrated in FIG. 7A can be obtained.

The manufacturing processes further include forming a second wiring structure 322 on the principal plane of the semiconductor substrate 404. The second wiring structure 322 includes the interlayer insulating films 124 to 127, the plug layers 129, 131, and 133, and the wiring layers 130, 132, and 134. In the present exemplary embodiment, the interlayer insulating films can be constituted by silicon dioxide films. The interlayer insulating films may be constituted by silicon nitride films, or organic resin films. The wiring layers can be constituted by wirings chiefly containing aluminum components or wirings chiefly containing copper components.

In the present exemplary embodiment, the connecting portions 314B can be formed by the conductive pattern that constitutes the wiring layer 134. A material chiefly containing copper components can be used to constitute the conductive pattern. The interlayer insulating film 106 which is the topmost interlayer insulating film functions as a passivation film and can be constituted by a silicon oxynitride film or a silicon nitride film. Further, general semiconductor processes are employable to form the wiring layers, the plug layers, and the interlayer insulating film, although detailed description thereof is omitted. When the above-described manufacturing processes have been thoroughly finished, the configuration illustrated in FIG. 7B can be obtained.

The manufacturing processes further includes laminating the first member 308' and the second member 309' illustrated in FIG. 6B and FIG. 7B in such a manner that the principal plane 402 and the principal plane 405 of these semiconductor substrates are bonded by facing to each other. More specifically, the uppermost surface of the wiring structure of the first member 308' is bonded to the uppermost surface of the wiring structure of the second member 309'. In the present exemplary embodiment, the first connecting portions 311 and 314 and 801 are constituted by the conductive pattern that chiefly contains copper components. Therefore, a metal junction of copper can be employed to realize the above-described lamination. The conductive pattern formed on the topmost surface of the seal ring 150A, which is brought into direct contact with the seal ring 150B, and the conductive pattern formed on the topmost surface of the seal ring 151B, which is brought into direct contact with the seal ring 150A, constitute the connecting portion 152. Further, the first wiring structure 321 illustrated in FIG. 6B and the second wiring structure 322 illustrated in FIG. 7B form a wiring structure 320.

After the first member 308' and the second member 309' are bonded, a backside 403 portion of the semiconductor substrate 401 constituting the first member 308' can be removed to reduce the entire thickness thereof. In other words, the first member 308' can be formed as a thin-film layer. Further, a backside 406 portion of the semiconductor substrate 404 constituting the second member 309' can be removed to reduce the entire thickness thereof. Namely, the second member 309' can be formed as a thin-film layer. Chemical mechanical polishing (CMP) or etching processing is employable to form the above-described thin-film layers according to the present exemplary embodiment. The semiconductor substrate 401 is finally configured as the semiconductor substrate 101 having a thickness of D1, which is smaller than D3, (i.e., D1<D3) (see FIG. 8A).

Reducing the thickness of the semiconductor substrate 401 to form the semiconductor substrate 101 as described above is desired because incident light can be effectively guided into the photoelectric conversion unit. The semiconductor substrate 404 is finally configured as the semiconductor substrate 121 having a thickness of D2, which is smaller than D4, (i.e., D2<D4) (see FIG. 8A). Further, in this case, the thickness D1 of the semiconductor substrate 101 is smaller than the thickness D2 of the semiconductor substrate 121 (i.e., D1<D2). In a case where the thickness of the second member 309' is not reduced, the thickness D1 of the semiconductor substrate 101 is smaller than the thickness D4 of the semiconductor substrate 404 (i.e., D1<D4).

The manufacturing processes further includes forming the planarization layer 115 made of a resin material, the color filter layer 116, the planarization layer 117 made of a resin material, and the microlens layer 118, in this order, on a backside 408 of the semiconductor substrate 101. Further, general semiconductor processes are employable to form the planarization layer, the color filter layer, and the microlens layer, although detailed description thereof is omitted. The microlens layer can be formed to cover the region 312' to be finally configured as the pad portion. When the above-described manufacturing processes have been thoroughly finished, the configuration illustrated in FIG. 8B can be obtained.

The manufacturing processes further include forming the openings 100 to uncover the surfaces of the pads 313. In the present exemplary embodiment, the photolithography technique is employed to provide a photoresist mask including arbitrary openings on the microlens layer 118. Then, the dry etching technique is employed to remove the microlens layer 118, the planarization layer 117, the color filter layer 116, the planarization layer 115, the semiconductor substrate 101, and an interlayer insulating film 104' and form the openings 100 to uncover the pads 313. Then, the microlens layer 118, the planarization layers 117 and 115, the color filter layer 116, the semiconductor substrate 101 and the interlayer insulating film 104 are formed. When the above-described manufacturing processes have been thoroughly finished, the configuration illustrated in FIG. 8C, i.e., the configuration illustrated in FIG. 4, can be obtained.

As described above, the seal rings 150A, 151A, 152A, and 150B can be formed in the same processes together with the wirings of the wiring structures. Further, in the etching processing, the pads 313 are functionally operable as etching stoppers.

The present invention is not limited to the processes of the manufacturing method according to the present exemplary embodiment. The order of the above-described manufacturing processes can be arbitrarily changed. Further, the first member 308 and the second member 309 can be formed sequentially or in parallel. Further, the first member 308 and the second member 309 can be purchased beforehand and later laminated to form a finished product. Further, each of the semiconductor substrates 401 and 402 can be constituted by a silicon on insulator (SOI) substrate.

Example 2

Figure 9A:
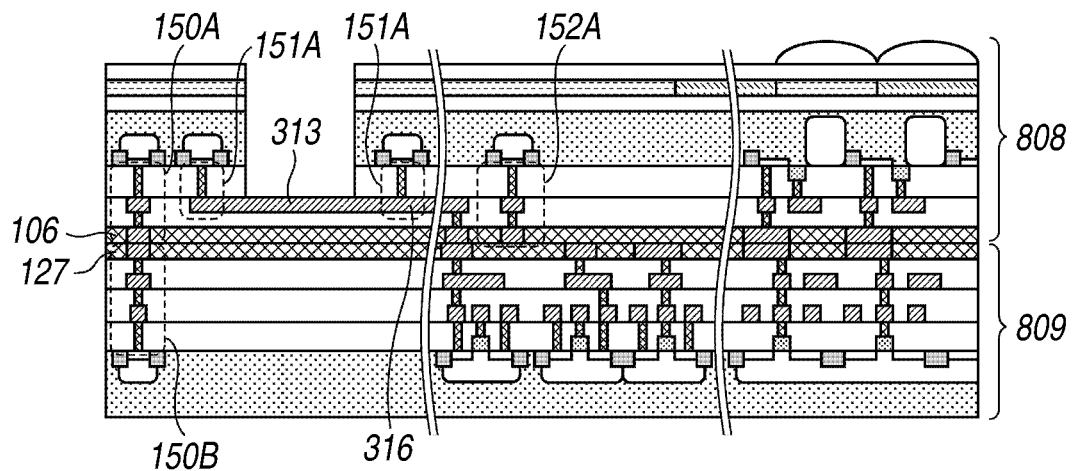
FIG. 9A is a cross-sectional view schematically illustrating a solid-state imaging apparatus according to a second exemplary embodiment.
Figure 9B:
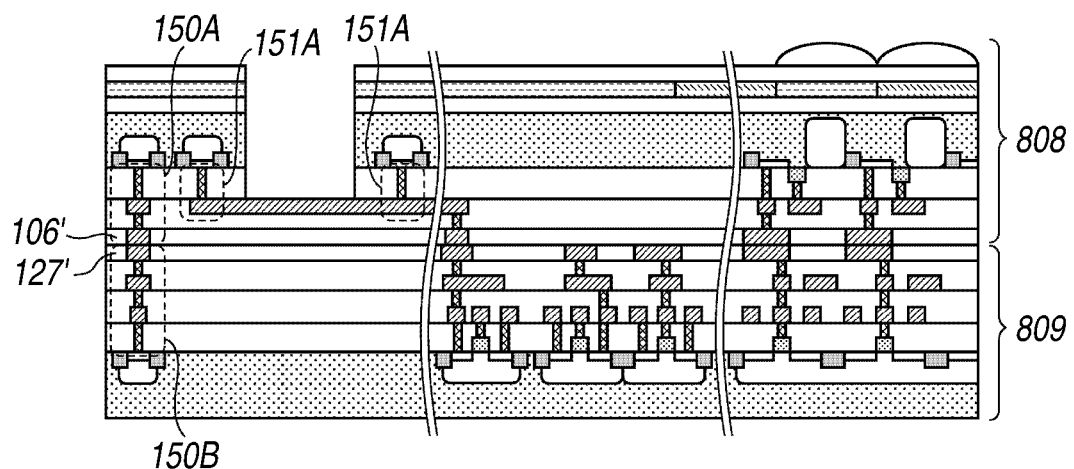
FIG. 9B is a cross-sectional view schematically illustrating the solid-state imaging apparatus according to the second exemplary embodiment.
Figure 9C:
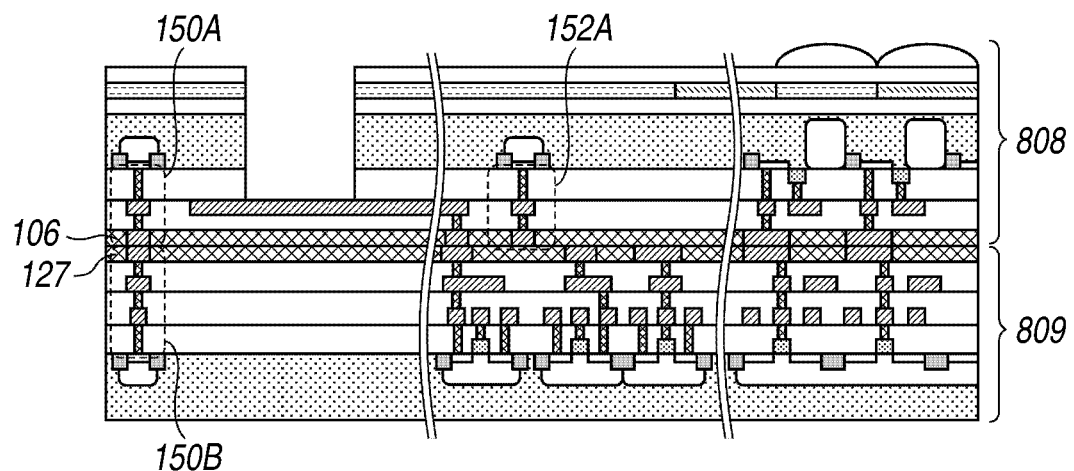
FIG. 9C is a cross-sectional view schematically illustrating the solid-state imaging apparatus according to the second exemplary embodiment.

A second exemplary embodiment of the present invention is described below with reference to FIGS. 9A to 9C. Each of FIG. 9A, FIG. 9B, and FIG. 9C is a cross-sectional view schematically illustrating a solid-state imaging apparatus. More specifically, FIGS. 9A to 9C are cross-sectional views illustrating modified examples of the solid-state imaging apparatus illustrated in FIG. 4. In FIGS. 9A to 9C, constituent components similar to those illustrated in FIG. 4 are denoted by the same reference numerals and their descriptions are not repeated.

The present exemplary embodiment is different from the first exemplary embodiment in the electric path extending from the pads 313 to the second member. In the above-described first exemplary embodiment, the plugs and the wirings are disposed in a projection area of the pads 313 disposed on the first member, which is vertically projected toward the second member. The electric path is formed to reach the lowermost wiring layer of the second member, and then electrical connection is formed so that signals can be transmitted and received to and from the circuit elements of the second member.

On the other hand, the electric path according to the present exemplary embodiment extends from the pads 313 to the peripheral circuit portion in the first member and further extends to the circuit elements of the second member via the plugs to form the electrical connection.

As illustrated in FIG. 9A, a first member 808 includes the draw-out wiring 316 that extends from the pad 313 to the peripheral circuit portion in the horizontal direction. Further, a second member 809 includes a connecting portion at a horizontally extended region, which is formed by the draw-out wiring 316 of the first member 808. The seal rings 150A, 151A, 152A, and 150B are similar to those described in the first exemplary embodiment.

The solid-state imaging apparatus illustrated in FIG. 9A includes the seal ring 151A. Therefore, it is required to provide at least one of the seal rings 150A and 152A. However, the configuration including continuously disposed seal rings 150A and 152A is effective to enhance the moisture resistance effects and suppress the chipping, as described in the first exemplary embodiment. Further, the pads 313 can be disposed at an arbitrary position if the pads 313 are positioned on the first member 808 side compared to the principal plane 122 of the second member 809.

Next, the configuration illustrated in FIG. 9B is described below. The solid-state imaging apparatus illustrated in FIG. 9B is different from that illustrated in FIG. 9A in that no passivation layer is provided. The insulating layer 106', whose function as a passivation layer is lower compared to that of a material containing SiN components, is disposed on the topmost surface of the wiring structure. In this case, since the solid-state imaging apparatus includes the seal ring 151A, the seal ring 152A is not indispensible as illustrated in FIG. 9B. As the seal rings 150A and 151B are provided, conductive patterns that constitute the topmost surfaces of respective members are in contact with each other.

Thus, the above-described configuration can suppress water invasion from the topmost surfaces of the first and second members that may occur in a case where no passivation layer is provided. Further, the seal ring 150B of the second member 809 is positioned outside the peripheral circuit portion, which is provided inside the pad portion, and is positioned inside the outer peripheral portion, which is provided outside the pad portion. The solid-state imaging apparatus illustrated in FIG. 9B includes the seal ring 150B disposed along the outermost periphery of the second member and can obtain effects similar to those obtainable from the configuration illustrated in FIG. 9A.

Next, the solid-state imaging apparatus illustrated in FIG. 9C is described below. The solid-state imaging apparatus illustrated in FIG. 9C is different from the solid-state imaging apparatus illustrated in FIG. 9A in that the seal ring 151A is not provided and passivation layers are provided to constitute topmost surfaces of the first and second members. In this case, the seal rings 150A and 150B can be omitted although the seal ring 152A is required. Further, the passivation layers of the above-described configuration can constitute a part of the seal ring.

The above-described configuration can reduce water invasion via a cross-sectional area of the wiring structure at each pad opening.

Example 3

Figure 10A:
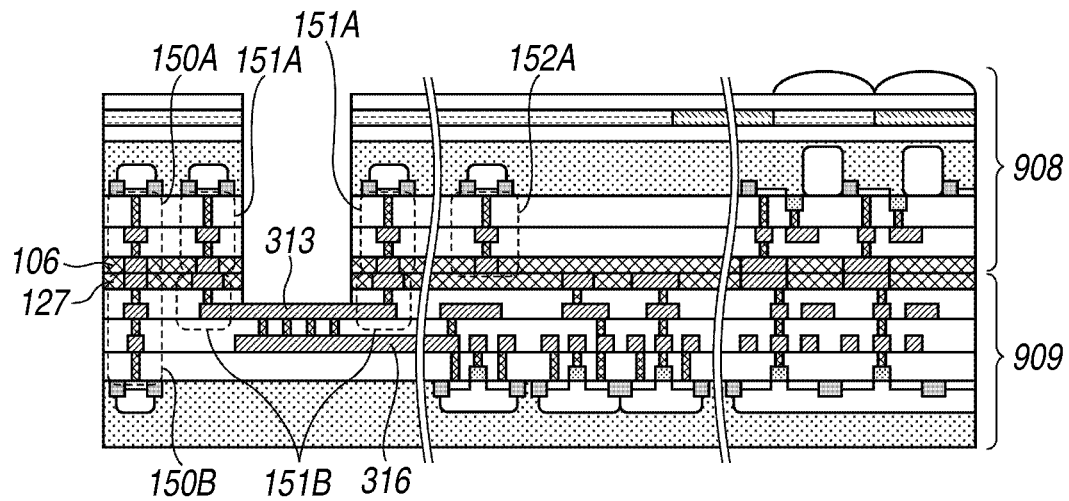
FIG. 10A is a schematic cross-sectional view illustrating a solid-state imaging apparatus according to a third exemplary embodiment.
Figure 10B:
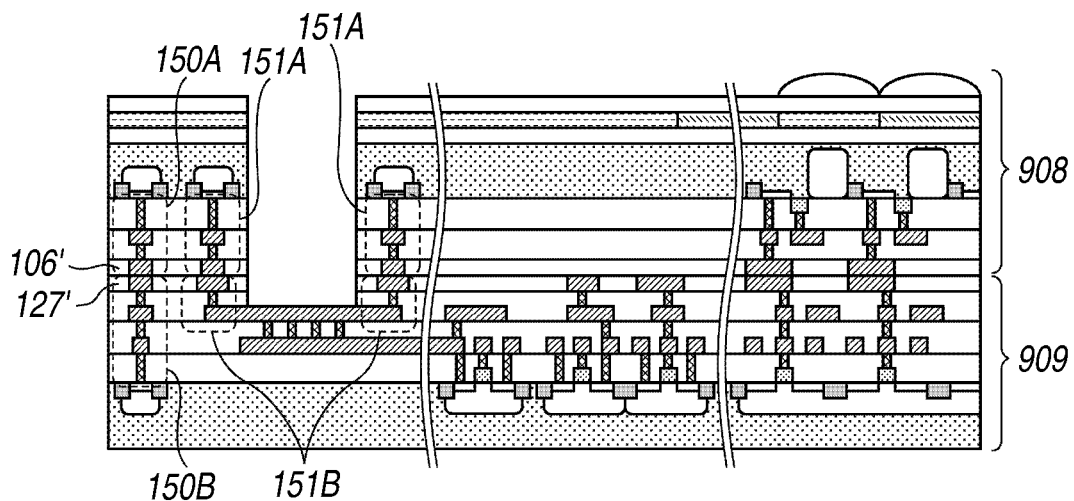
FIG. 10B is a schematic cross-sectional view illustrating the solid-state imaging apparatus according to the third exemplary embodiment.
Figure 10C:
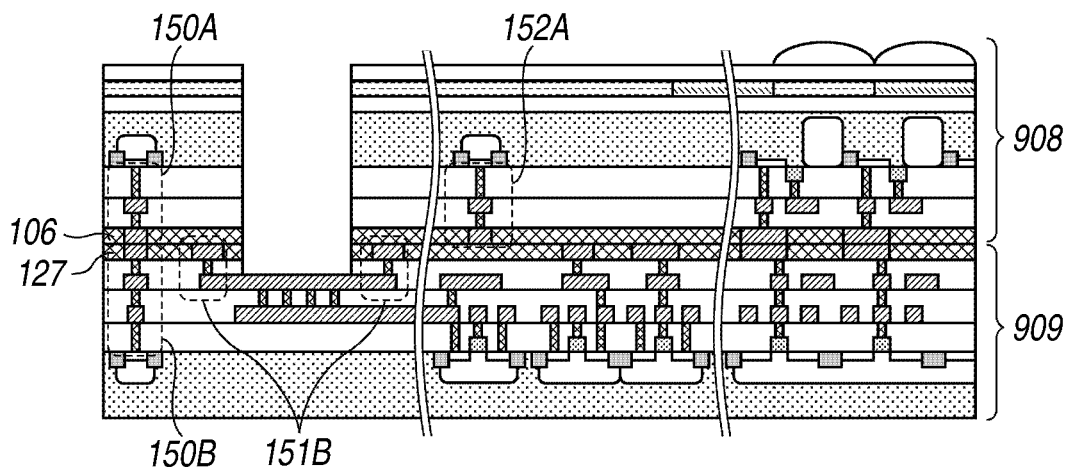
FIG. 10C is a schematic cross-sectional view illustrating the solid-state imaging apparatus according to the third exemplary embodiment.
Figure 11:
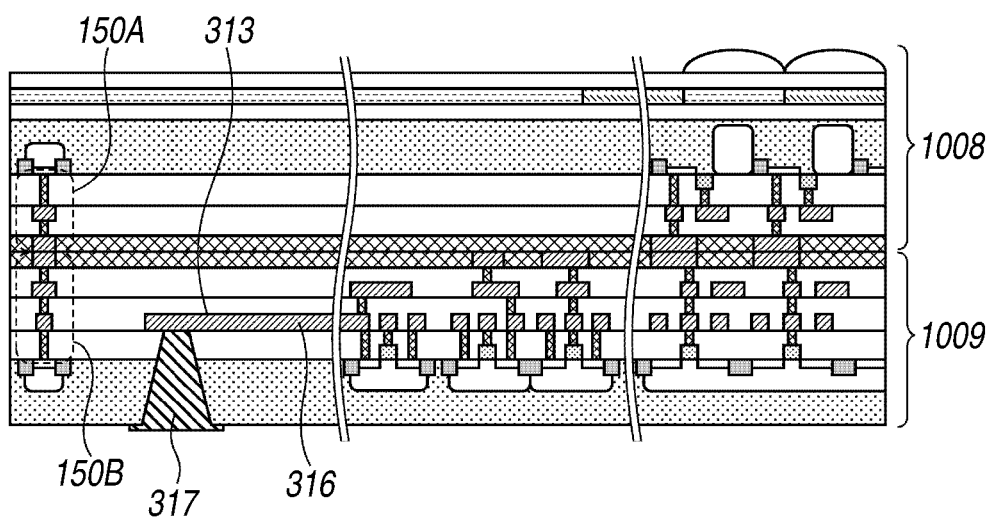
FIG. 11 is a cross-sectional view schematically illustrating a solid-state imaging apparatus according to the third exemplary embodiment.

A third exemplary embodiment of the present invention is described below with reference to FIGS. 10A to 10C and FIG. 11. Each of FIG. 10A, FIG. 10B and FIG. 10C is a cross-sectional view schematically illustrating a solid-state imaging apparatus. More specifically, FIGS. 10A to 10C are cross-sectional views illustrating modified examples of the solid-state imaging apparatus illustrated in FIG. 4. FIG. 11 illustrates another modified example of the solid-state imaging apparatus illustrated in FIGS. 10A to 10C. In FIGS. 10A to 10C and FIG. 11, constituent components similar to those illustrated in FIG. 4 are denoted by the same reference numerals and their descriptions are not repeated.

The present exemplary embodiment is different from the first exemplary embodiment in the arrangement of the pads.

The solid-state imaging apparatus illustrated in FIG. 10A is different from the solid-state imaging apparatus illustrated in FIG. 4 in that a conductive pattern that constitutes a pad 1013 is provided on a second member 909. Then, a part of a first member 908, which corresponds to the pad portion of the first member 908, extends therethrough. Further, the second member 909 includes the draw-out wiring 316 that extends from the pad 313 in the horizontal direction. The seal ring can be formed to have a configuration similar to the seal ring described in the first exemplary embodiment. When the above-described configuration is employed, adverse influences of exogenous noises can be suppressed.

The solid-state imaging apparatus illustrated in FIG. 10A includes the seal ring 151A. Therefore, it is required to provide at least one of the seal rings 150A and 152A. The configuration including the seal rings 150A and 150B connected along the entire periphery thereof is effective to enhance the moisture resistance effects and suppress the chipping, as described in the first exemplary embodiment.

The solid-state imaging apparatus illustrated in FIG. 10B is different from the solid-state imaging apparatus illustrated in FIG. 10A in that no passivation layer is provided. The insulating layer 106', whose function as a passivation layer is lower compared to that of a material containing SiN components, is disposed on the topmost surface of the wiring structure. In other words, the solid-state imaging apparatus illustrated in FIG. 10B is similar to the solid-state imaging apparatus illustrated in FIG. 9B. In this case, as the solid-state imaging apparatus includes the seal rings 151A and 151B, the seal ring 152A as illustrated in FIG. 9B is not indispensible. However, the seal rings 150A and 150B are disposed.

Thus, the above-described configuration can reduce the possibility of water invasion from the topmost surfaces of the first and second members that may occur in a case where no passivation layer is provided. Further, the seal ring of the second member 809 is positioned outside the peripheral circuit portion, which is provided inside the pad portion, and is positioned inside the outer peripheral portion, which is provided outside the pad portion. The solid-state imaging apparatus illustrated in FIG. 10B includes the seal ring 150A disposed along the outermost periphery and can obtain effects similar to those obtainable from the configuration illustrated in FIG. 10A.

Next, the solid-state imaging apparatus illustrated in FIG. 10C is described below. The solid-state imaging apparatus illustrated in FIG. 10C is different from the solid-state imaging apparatus illustrated in FIG. 10A in that the seal ring 151A is not provided and passivation layers are provided to constitute topmost surfaces of the first and second members. In other words, the solid-state imaging apparatus illustrated in FIG. 10C is similar to the solid-state imaging apparatus illustrated in FIG. 9C. In this case, the seal ring 150A can be omitted although the seal rings 152A, 150B, and 151B are required. The above-described configuration can reduce water invasion via a cross-sectional area of the wiring structure at each pad opening. In this case, it is unnecessary to connect the seal rings 150A and 150B along the entire periphery thereof.

FIG. 11 illustrates a modified example of the solid-state imaging apparatus illustrated in FIGS. 10A to 10C, in which the pad 313 is provided on a second member 1009. The solid-state imaging apparatus illustrated in FIG. 11 includes a through electrode 317 that extends across the second substrate from the backside thereof to the pad 313. The pad 313 can be formed by a conductive pattern similar to the wiring layer. Further, the pad 313 is an electrode pad connected to the through electrode 317 that extends across the semiconductor substrate from one surface to the other surface positioned on the opposite side. Further, it is unnecessary to form the seal ring 151A of the pad portion having been described in other exemplary embodiments if the seal rings 150A and 150B are provided. When the configuration illustrated in FIG. 11 is employed, the solid-state imaging apparatus can be connected to other circuit substrate at the backside thereof. Therefore, downsizing of the solid-state imaging apparatus can be realized.

Example 4

Figure 12A:
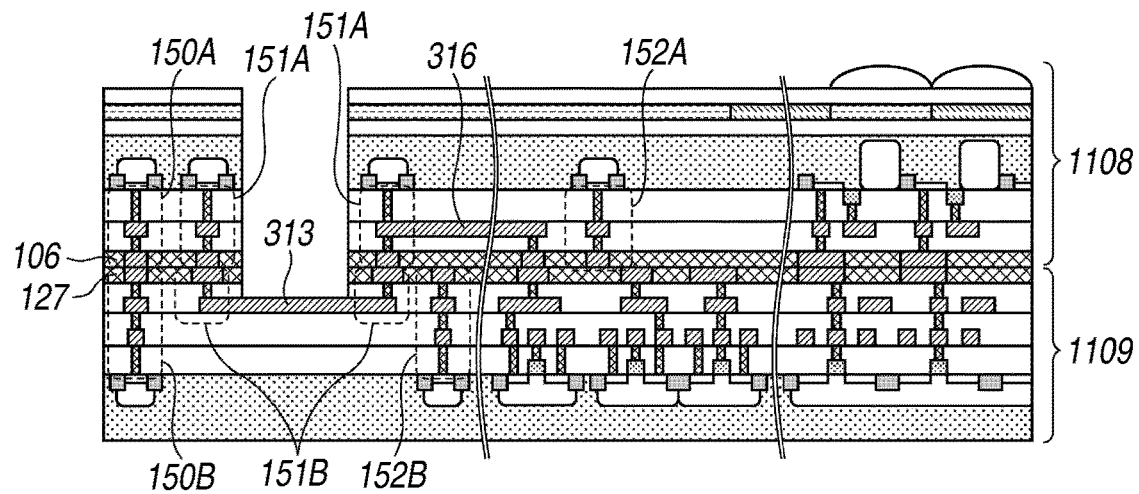
FIG. 12A is a schematic cross-sectional view illustrating a solid-state imaging apparatus according to a fourth exemplary embodiment.
Figure 12B:
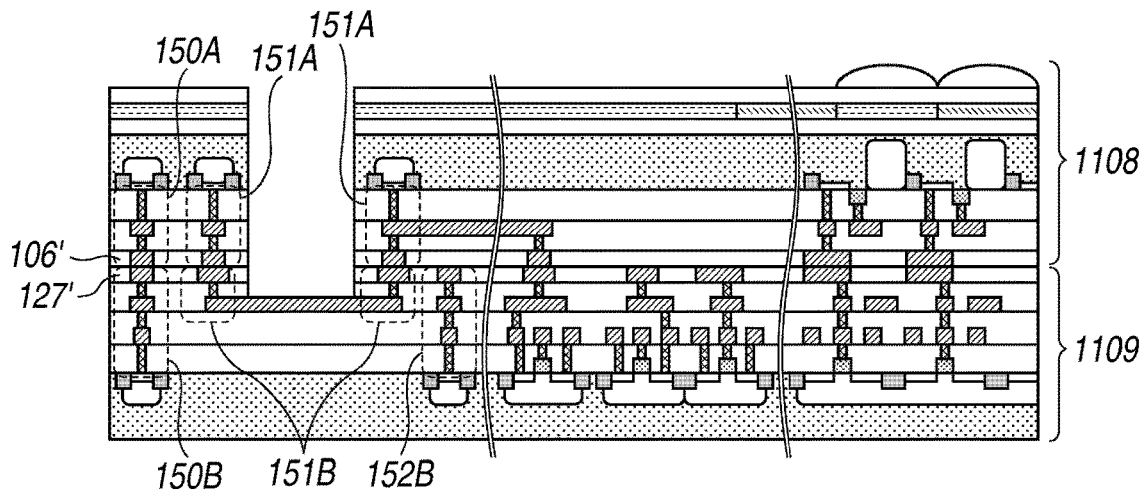
FIG. 12B is a schematic cross-sectional view illustrating the solid-state imaging apparatus according to the fourth exemplary embodiment.
Figure 12C:
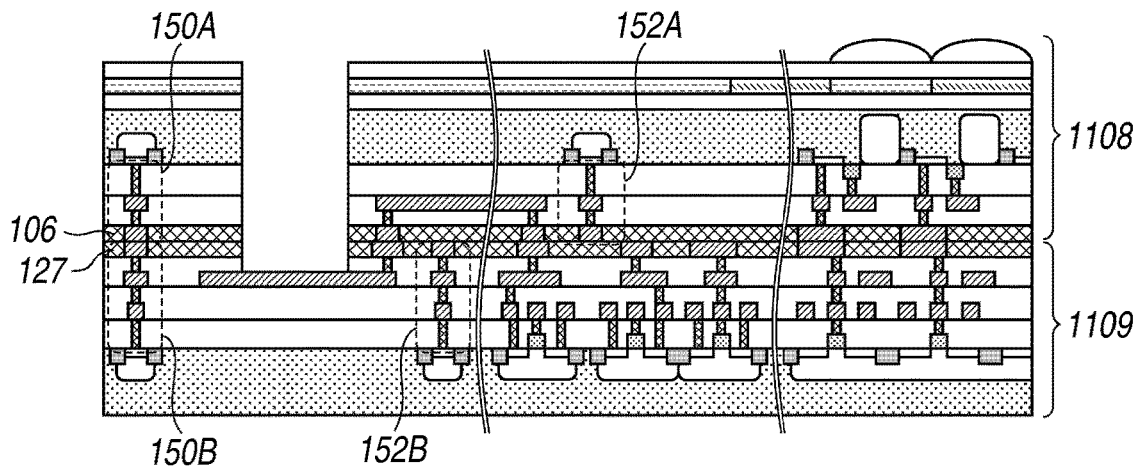
FIG. 12C is a schematic cross-sectional view illustrating the solid-state imaging apparatus according to the fourth exemplary embodiment.

A fourth exemplary embodiment of the present invention is described below with reference to FIGS. 12A to 12C. Each of FIG. 12A, FIG. 12B, and FIG. 12C is a cross-sectional view schematically illustrating a solid-state imaging apparatus. More specifically, FIGS. 12A to 12C are cross-sectional views illustrating modified examples of the solid-state imaging apparatus illustrated in FIG. 4. In FIGS. 12A to 12C, constituent components similar to those illustrated in FIG. 4 are denoted by the same reference numerals and their descriptions are not repeated.

The present exemplary embodiment is different from the first exemplary embodiment in the arrangement of the draw-out wiring 316 and the pad portion. Similar to the solid-state imaging apparatus illustrated in FIGS. 10A to 10C, the solid-state imaging apparatus illustrated in FIGS. 12A to 12C include a first member 1108 and a second member 1109 that are partly removed for wire bonding.

The solid-state imaging apparatus illustrated in FIG. 12A is different from the solid-state imaging apparatus illustrated in FIG. 4 in that a portion corresponding to the pad portion of the first member 1108 is removed and the pad 313 is included in the second member 1109. Further, the solid-state imaging apparatus illustrated in FIG. 12A includes the draw-out wiring 316 located on the first member 1108 to electrically connect the pad 313 of the second member 1109 to the peripheral circuit portion.

The seal rings 150A, 151A, and 152A are provided in the first member 1108 to constitute the first sealing portion. Further, the seal rings 150B, 151B, and 152B are provided in the second member 1109 to constitute the second sealing portion. Similar to the above-described exemplary embodiments, it is desired to constitute the first sealing portion and the second sealing portion to have the capability of suppressing adverse influences of exogenous noises. Further, the seal ring 152B of the second member 1109 is disposed between the pad portion and the peripheral circuit.

Further, it is desired that the seal ring 152B is disposed in such a way as to surround the peripheral circuit portion, when vertically projected from the first member 1108 side toward the second substrate of the second member 1109. The solid-state imaging apparatus illustrated in FIG. 12A includes the seal ring 151A. Therefore, it is required to provide at least one of the seal rings 150A and 152A. Further, the solid-state imaging apparatus illustrated in FIG. 12A includes the seal ring 151B. Therefore, it is required to provide at least one of the seal rings 150B and 152B.

Next, the solid-state imaging apparatus illustrated in FIG. 12B is described below. The configuration illustrated in FIG. 12B is different from the solid-state imaging apparatus illustrated in FIG. 12A in that no passivation layer is provided. The insulating layer 106', whose function as a passivation layer is lower compared to that of a material containing SiN components, is disposed on the topmost surface of the wiring structure. In other words, the solid-state imaging apparatus illustrated in FIG. 12B is similar to the solid-state imaging apparatus illustrated in FIG. 9B and FIG. 10B. In this case, since the solid-state imaging apparatus includes the seal rings 151A and 151B, the seal ring 152A is not indispensible but the seal ring 150A is disposed as illustrated in FIG. 12B.

The above-described configuration can reduce water invasion from the topmost surfaces of the first and second members even if no passivation layer is provided. The seal ring 152B can be omitted if the seal rings 150B and 151B are provided. However, providing the seal ring 152B is desired to improve the moisture resistance.

Next, the solid-state imaging apparatus illustrated in FIG. 12C is described below. The configuration illustrated in FIG. 12C is different from the solid-state imaging apparatus illustrated in FIG. 12A in that the wiring structure does not include the seal ring 151A and passivation layers are provided to constitute topmost surfaces of the first and second members. The solid-state imaging apparatus illustrated in FIG. 12C includes the seal ring 150A, the seal ring 152A, and the seal ring 152B. The above-described configuration can reduce water invasion via a cross-sectional area of the wiring structure at each pad opening. If the pads 313 are provided on the topmost surface of the second member, the seal ring 152B can be omitted. However, providing the seal ring 152B is desired to improve the moisture resistance.

The above-described solid-state imaging apparatuses include the first member and the second member that are connected in an overlapped fashion. If the seal rings 150A and 150B of the first and second member are electrically connected to each other and are respectively connected to semiconductor areas disposed on the substrates thereof, it is desired that these semiconductor areas are similar in conduction type.

On the other hand, if the seal rings of the first and second members are not connected to each other and independently arranged, semiconductor substrates that are different in conduction type can be used. The configuration independently arranging the seal rings of the first and second members can bring an effect of protecting the substrate of one member from being adversely influenced by a noise entering the substrate of the other member regardless of the conduction type of each semiconductor substrate provided in the first and second members.

Example 5

A solid-state imaging apparatus according to a fifth exemplary embodiment is described below with reference to FIG. 13. The solid-state imaging apparatus according to the fifth exemplary embodiment is different from the solid-state imaging apparatus described in the first to fourth exemplary embodiments in that seal rings constituted by electric conductors are not in contact with each other at the sealing portions of the first member and the second member. Instead, passivation layers constituting the topmost surfaces of the first member and the second member are in contact with each other.

Figure 13:
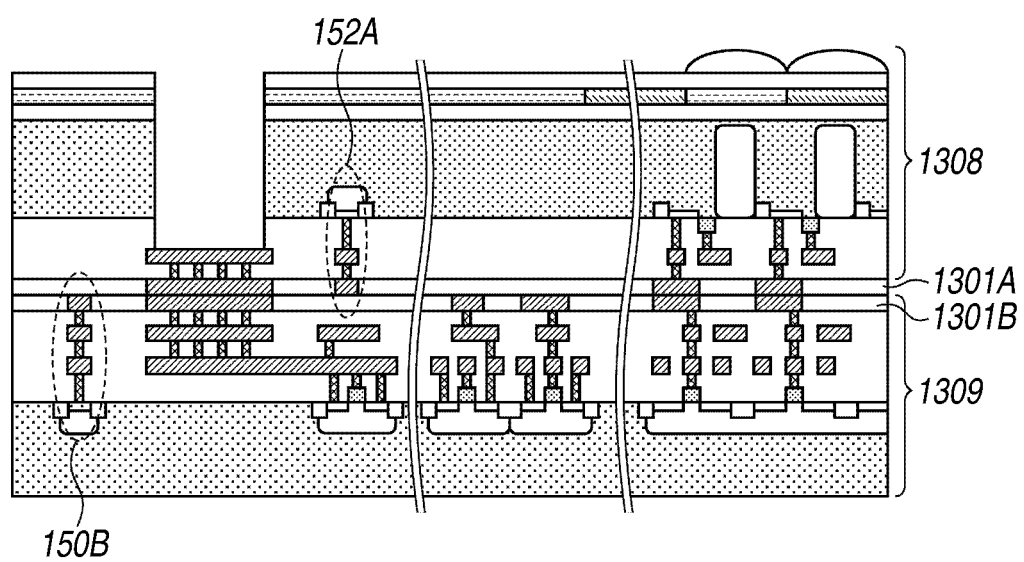
FIG. 13 is a cross-sectional view schematically illustrating a solid-state imaging apparatus according to a fifth exemplary embodiment.

In the configuration illustrated in FIG. 13, a first member 1308 includes a seal ring 152A constituted by an electric conductor. A second member 1309 includes a seal ring 150B constituted by an electric conductor. The seal rings 152A and 150B are mutually offset in the horizontal direction. Conductive patterns that constitute the topmost surfaces of the first member 1308 and the second member 1309 are not in contact with each other. However, passivation layers 1301A and 1301B having excellent moisture-absorption characteristics are provided on the topmost surfaces, so that sealing properties can be maintained adequately.

An example imaging system that includes a solid-state imaging apparatus, as a practical application of the solid-state imaging apparatus according to any one of the above-described exemplary embodiments, is described below. The imaging system is not limited to a photographing device, such as a camera, and can be any other device (e.g., a personal computer or a portable terminal) if it accessorily has the capability of capturing an image. For example, a camera can include a solid-state imaging apparatus according to the present invention and a processing unit configured to process an output signal of the solid-state imaging apparatus. The above-described processing unit can be configured to include, for example, an analog-to-digital (AD) converter and a processor that can process digital data output from the AD converter.

As described above, the solid-state imaging apparatus according to the present invention can reduce water invasion into the photoelectric conversion unit or the peripheral circuit portion. Further, the manufacturing method according to the present invention can accomplish the connection of the seal rings at the same time as the connection of the first member and the second member at their connecting portions. Therefore, it becomes feasible to improve the moisture resistance and suppress the chipping without increasing time required to finish the manufacturing processes.

The present invention is not limited to the configurations having been described in the exemplary embodiments. The conduction type and the circuits can be changed to an opposite conduction type. Further, the present invention is applicable to a case where the connecting portions are provided only in an area not including the pixel portion (e.g., the peripheral circuit portion). Further, the configurations described in respective exemplary embodiments are appropriately combinable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

301 pixel portion
302 peripheral circuit portion
308 first member
309 second member
150 seal ring
151 seal ring
152 seal ring

The invention claimed is:

1. An apparatus comprising:
   a first semiconductor substrate that includes a first transistor and an opening;
   a second semiconductor substrate that includes a second transistor, one of the first semiconductor substrate and the second semiconductor substrate being stacked on the other;
   a first layer provided between the first semiconductor substrate and the second semiconductor substrate and including a first conductive pattern connected to the first transistor;
   a second layer provided between the first layer and the second semiconductor substrate and including a second conductive pattern connected to the second transistor;

a first portion including the first transistor and the second transistor in plan view;
a second portion located between the opening and the second semiconductor substrate; and
a seal portion;
wherein the seal portion at least includes a third conductive pattern included in the first layer and a fourth conductive pattern included in the second layer,
wherein the second portion is surrounded by the third conductive pattern and the fourth conductive pattern, and
wherein a part of the third conductive pattern is located between the second portion and the first conductive pattern, and a part of the fourth conductive pattern is located between the second portion and the second conductive pattern.

2. An apparatus comprising:
a first semiconductor substrate that includes a first transistor and an opening;
a second semiconductor substrate that includes a second transistor, one of the first semiconductor substrate and the second semiconductor substrate being stacked on the other;
a first layer provided between the first semiconductor substrate and the second semiconductor substrate and including a first conductive pattern connected to the first transistor;
a second layer provided between the first layer and the second semiconductor substrate and including a second conductive pattern connected to the second transistor;
a first portion including the first transistor and the second transistor in plan view;
a second portion located between the opening and the second semiconductor substrate; and
a seal portion;
wherein the seal portion at least includes a third conductive pattern included in the first layer and a fourth conductive pattern included in the second layer,
wherein the first conductive pattern is surrounded by the third conductive pattern, and the second conductive pattern is surrounded by the fourth conductive pattern, and
wherein a part of the third conductive pattern is located between the second portion and the first conductive pattern, and a part of the fourth conductive pattern is located between the second portion and the second conductive pattern.

3. The apparatus according to claim 1,
wherein thickness of the first semiconductor substrate is less than thickness of the second semiconductor substrate.

4. The apparatus according to claim 1,
wherein the second portion includes a fifth conductive pattern located between the opening and the second semiconductor substrate.

5. The apparatus according to claim 4,
wherein, between the opening and the fifth conductive pattern, an opening is provided in an insulator provided between the first semiconductor substrate and the second semiconductor substrate.

6. The apparatus according to claim 4,
wherein a wiring connected to the fifth conductive pattern is provided between the fifth conductive pattern and the second semiconductor substrate.

7. The apparatus according to claim 1,
wherein the second portion includes a fifth conductive pattern located between the opening and the second semiconductor substrate, and
wherein the third conductive pattern is located between the fifth conductive pattern and the first semiconductor substrate.

8. The apparatus according to claim 2,
wherein the second portion includes a fifth conductive pattern located between the opening and the second semiconductor substrate, and
wherein the part of the third conductive pattern is located between the first conductive pattern and the fifth conductive pattern.

9. The apparatus according to claim 8,
wherein the fifth conductive pattern is included in the first layer.

10. The apparatus according to claim 4,
wherein a distance between the fifth conductive pattern and the second semiconductor substrate is longer than a distance between the second conductive pattern and the second semiconductor substrate.

11. The apparatus according to claim 4,
wherein a distance between the fifth conductive pattern and the second semiconductor substrate is shorter than a distance between the second conductive pattern and the second semiconductor substrate.

12. The apparatus according to claim 1, further comprising:
a third layer provided between the second layer and the second semiconductor substrate and including a sixth conductive pattern connected to the second conductive pattern.

13. The apparatus according to claim 12,
wherein the third layer includes a seventh conductive pattern by which the second portion is surrounded, and
wherein a part of the seventh conductive pattern is located between the second portion and the sixth conductive pattern.

14. The apparatus according to claim 1,
wherein the first layer includes a conductive pattern by which the first conductive pattern and the third conductive pattern are surrounded, and
wherein the second layer includes a conductive pattern by which the second conductive pattern and the fourth conductive pattern are surrounded.

15. The apparatus according to claim 4,
wherein a chief component of the first conductive pattern is copper, and
wherein a chief component of the fifth conductive pattern is aluminum.

16. The apparatus according to claim 1,
wherein the first semiconductor substrate includes a photoelectric conversion unit.

17. The apparatus according to claim 16,
wherein the first transistor is a transfer transistor configured to transfer electric charge of the photoelectric conversion unit.

18. The apparatus according to claim 16,
wherein the second semiconductor substrate includes a scanning circuit.

19. The apparatus according to claim 4,
wherein the fifth conductive pattern is a pad for wire bonding.

20. The apparatus according to claim 4,
wherein the fifth conductive pattern is a pad for wire bonding.

21. A system, comprising:
the apparatus according to claim 1; and
a processor configured to process a signal outputted from the apparatus;
wherein the second semiconductor substrate includes a circuit that performs analog-to-digital (AD) conversion.

22. A camera, comprising:
the apparatus according to claim 1; and
a processing unit configured to process a signal outputted from the apparatus;
wherein the apparatus is a back-lit solid-state imaging apparatus.

23. A system, comprising:
the apparatus according to claim 2; and
a processor configured to process a signal outputted from the apparatus;
wherein the second semiconductor substrate includes a circuit that performs analog-to-digital (AD) conversion.

24. A camera, comprising:
the apparatus according to claim 2; and
a processing unit configured to process a signal outputted from the apparatus;
wherein the apparatus is a back-lit solid-state imaging apparatus.

* * * * *